United States Patent
Zhang et al.

(10) Patent No.: US 9,786,378 B1
(45) Date of Patent: Oct. 10, 2017

(54) EQUALIZING ERASE DEPTH IN DIFFERENT BLOCKS OF MEMORY CELLS

(71) Applicant: SanDisk Technologies LLC, Plano, TX (US)

(72) Inventors: Zhengyi Zhang, Mountain View, CA (US); Liang Pang, Fremont, CA (US); Caifu Zeng, San Jose, CA (US); Xuehong Yu, San Jose, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/367,549

(22) Filed: Dec. 2, 2016

(51) Int. Cl.
| G11C 11/34 | (2006.01) |
| G11C 16/04 | (2006.01) |
| G11C 16/16 | (2006.01) |
| G11C 16/34 | (2006.01) |
| G11C 16/10 | (2006.01) |
| G11C 16/26 | (2006.01) |

(52) U.S. Cl.
CPC .......... *G11C 16/16* (2013.01); *G11C 16/0483* (2013.01); *G11C 16/10* (2013.01); *G11C 16/26* (2013.01); *G11C 16/3445* (2013.01)

(58) Field of Classification Search
CPC . G11C 16/16; G11C 16/0438; G11C 16/3445; G11C 16/10; G11C 16/26
See application file for complete search history.

(56) References Cited

U.S. PATENT DOCUMENTS

| 7,551,477 | B2 | 6/2009 | Mokhlesi et al. | |
| 8,874,825 | B2 | 10/2014 | Alrod et al. | |
| 8,909,493 | B2 | 12/2014 | Avila et al. | |
| 9,015,407 | B1 | 4/2015 | Dusija et al. | |
| 9,202,593 | B1 | 12/2015 | Magia et al. | |
| 9,257,191 | B1 * | 2/2016 | Yuan | G11C 11/5635 |
| 9,418,750 | B2 | 8/2016 | Wang et al. | |
| 9,449,698 | B1 | 9/2016 | Paudel et al. | |
| 9,514,827 | B1 * | 12/2016 | Nam | G11C 16/16 |
| 2014/0043913 | A1 * | 2/2014 | Shiga | G11C 16/3436 365/185.21 |
| 2014/0169093 | A1 * | 6/2014 | Parat | G11C 16/16 365/185.11 |
| 2014/0226416 | A1 * | 8/2014 | Li | G11C 16/0483 365/185.26 |
| 2015/0063027 | A1 * | 3/2015 | Hashimoto | G11C 16/26 365/185.11 |

(Continued)

Primary Examiner — Toan Le
(74) Attorney, Agent, or Firm — Vierra Magen Marcus LLP

(57) ABSTRACT

A memory device and associated techniques provide a uniform erase depth for different blocks of memory cells which are at different distances from pass gates of a voltage source. In one approach, a voltage of a source side select gate transistor of a memory string is a decreasing function of the distance. In another approach, a magnitude or duration of an erase voltage at a source end of a memory string is an increasing function of the distance. Adjacent blocks can be arranged in subsets and treated as being at a common distance. In another approach, an additional erase pulse can be applied when the distance of the block exceeds a threshold. Other variables such as initial erase voltage and step size can also be adjusted as a function of distance.

20 Claims, 21 Drawing Sheets

(56) References Cited

U.S. PATENT DOCUMENTS

2015/0092494 A1* 4/2015 Rhie ................ G11C 16/16
                                                365/185.12
2016/0217860 A1* 7/2016 Lai ................ G11C 11/5628
2016/0314833 A1* 10/2016 Lee ................ G11C 11/5635

* cited by examiner

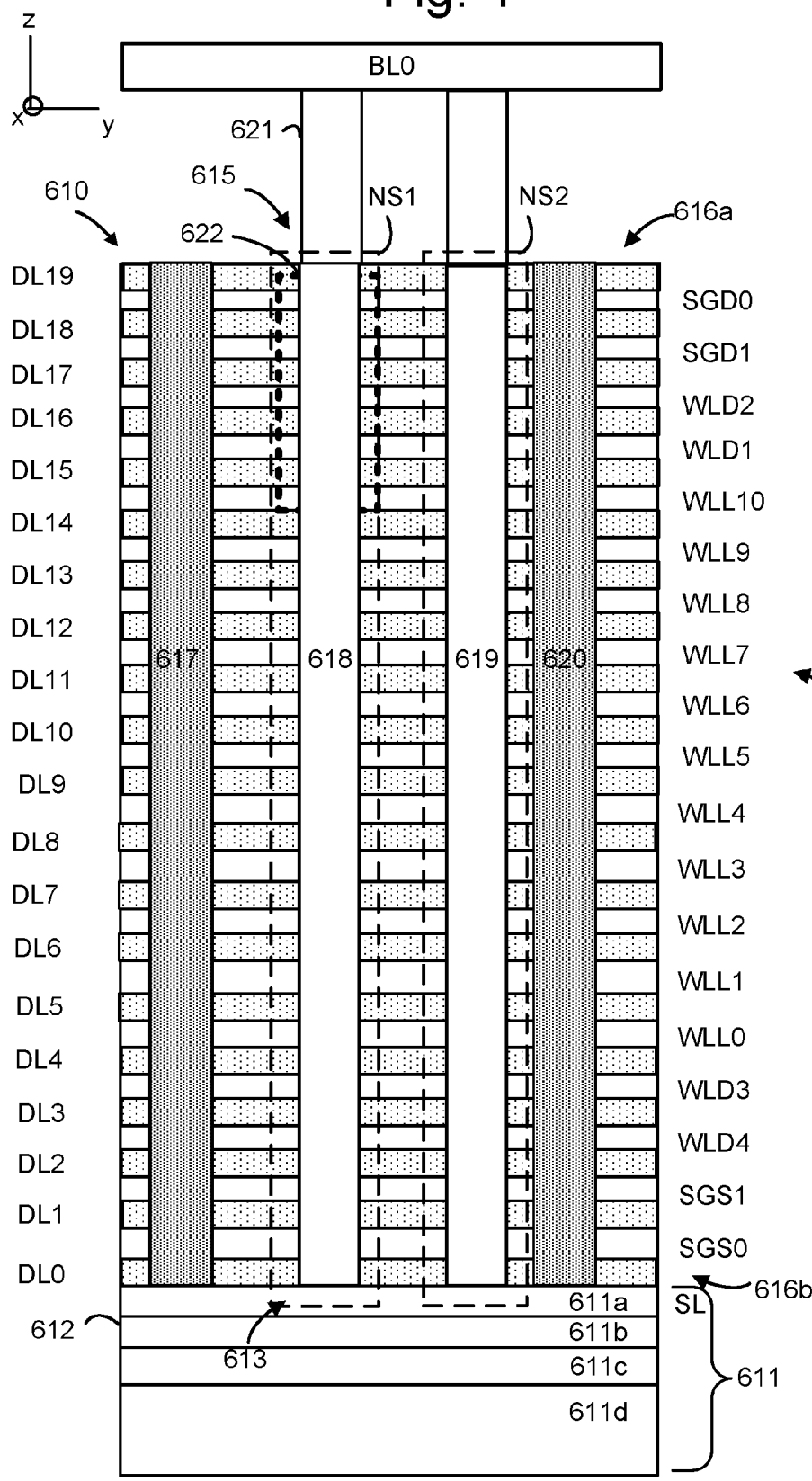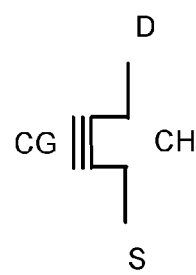

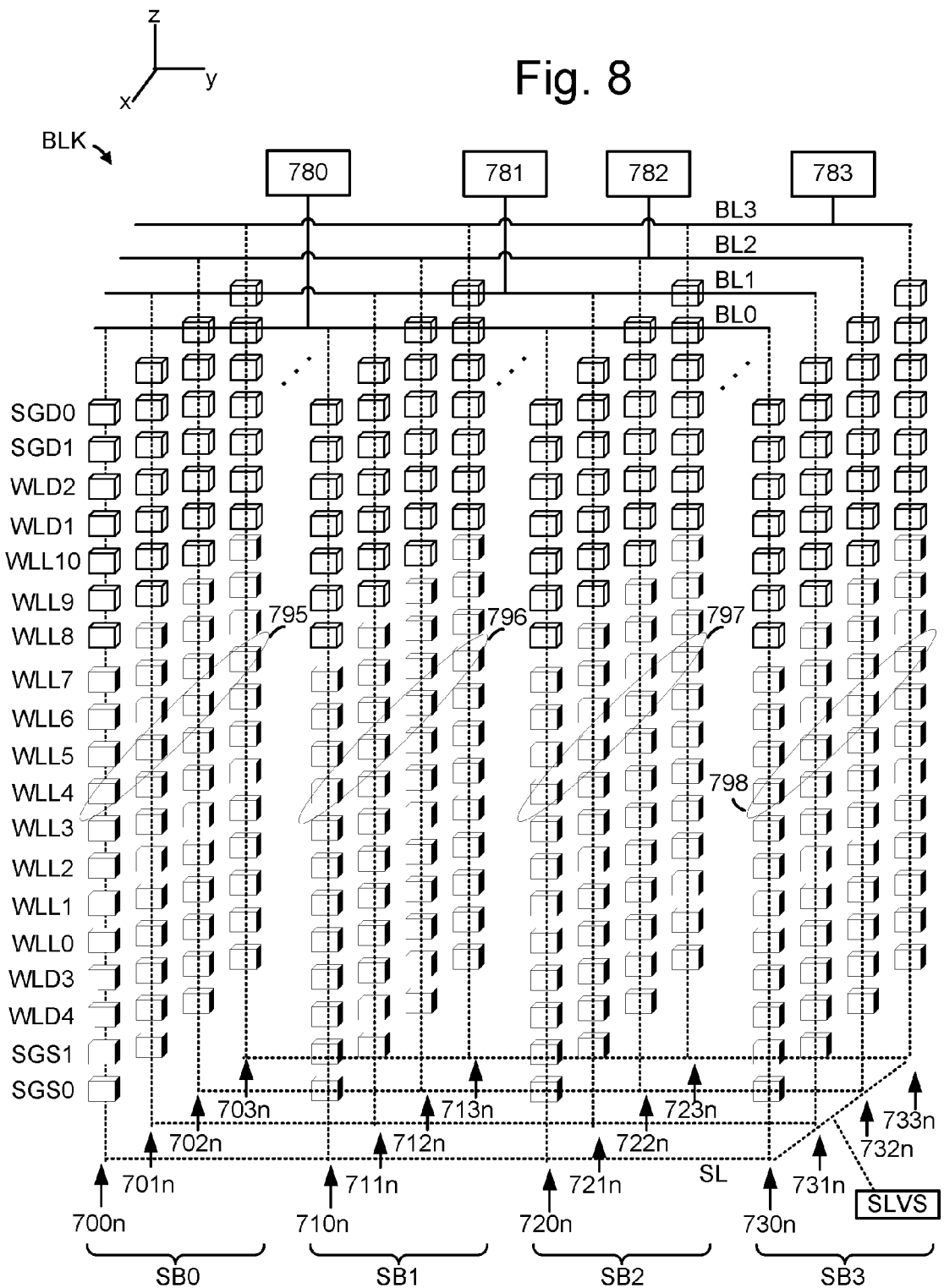

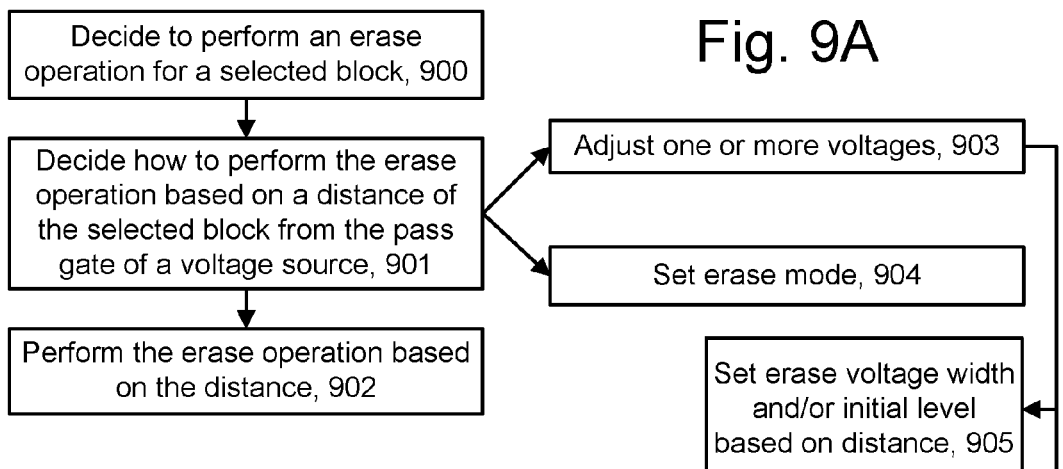
Fig. 9A
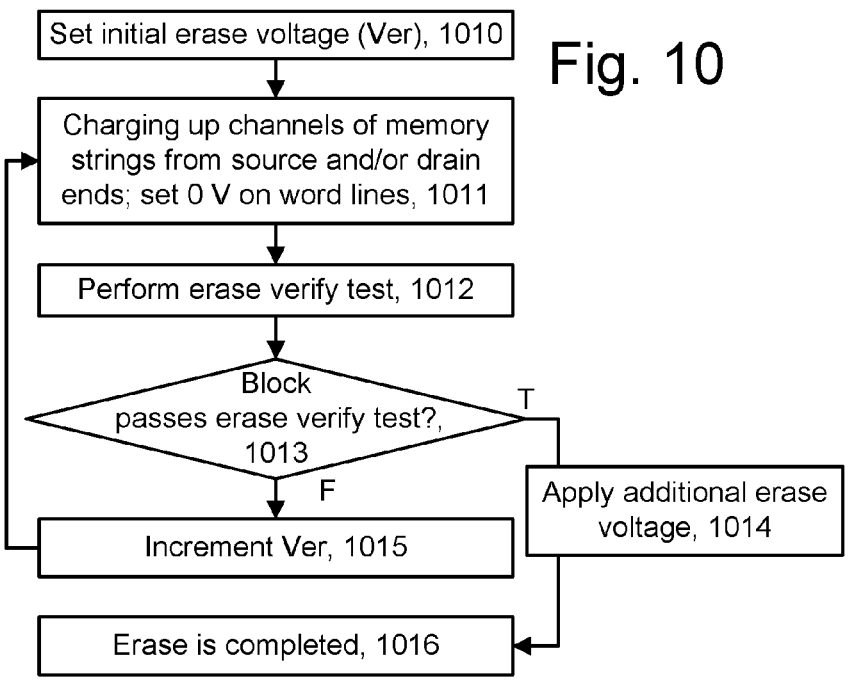
Fig. 9B
Fig. 10

US 9,786,378 B1

EQUALIZING ERASE DEPTH IN DIFFERENT BLOCKS OF MEMORY CELLS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 4 depicts an example cross-sectional view of a portion of one of the blocks of FIG. 3.

FIG. 5 depicts an example transistor 590.

FIG. 8 depicts additional detail of the sub-blocks SB0-SB3 of FIG. 7.

FIG. 9A depicts an example process for performing an erase operation in which the erase depth is equalized for different blocks.

FIG. 9B depicts an example table for implementing the process of FIG. 9A.

FIG. 10 depicts an example process for performing an erase operation consistent with step 902 of FIG. 9A.

DETAILED DESCRIPTION

Figure 1A:
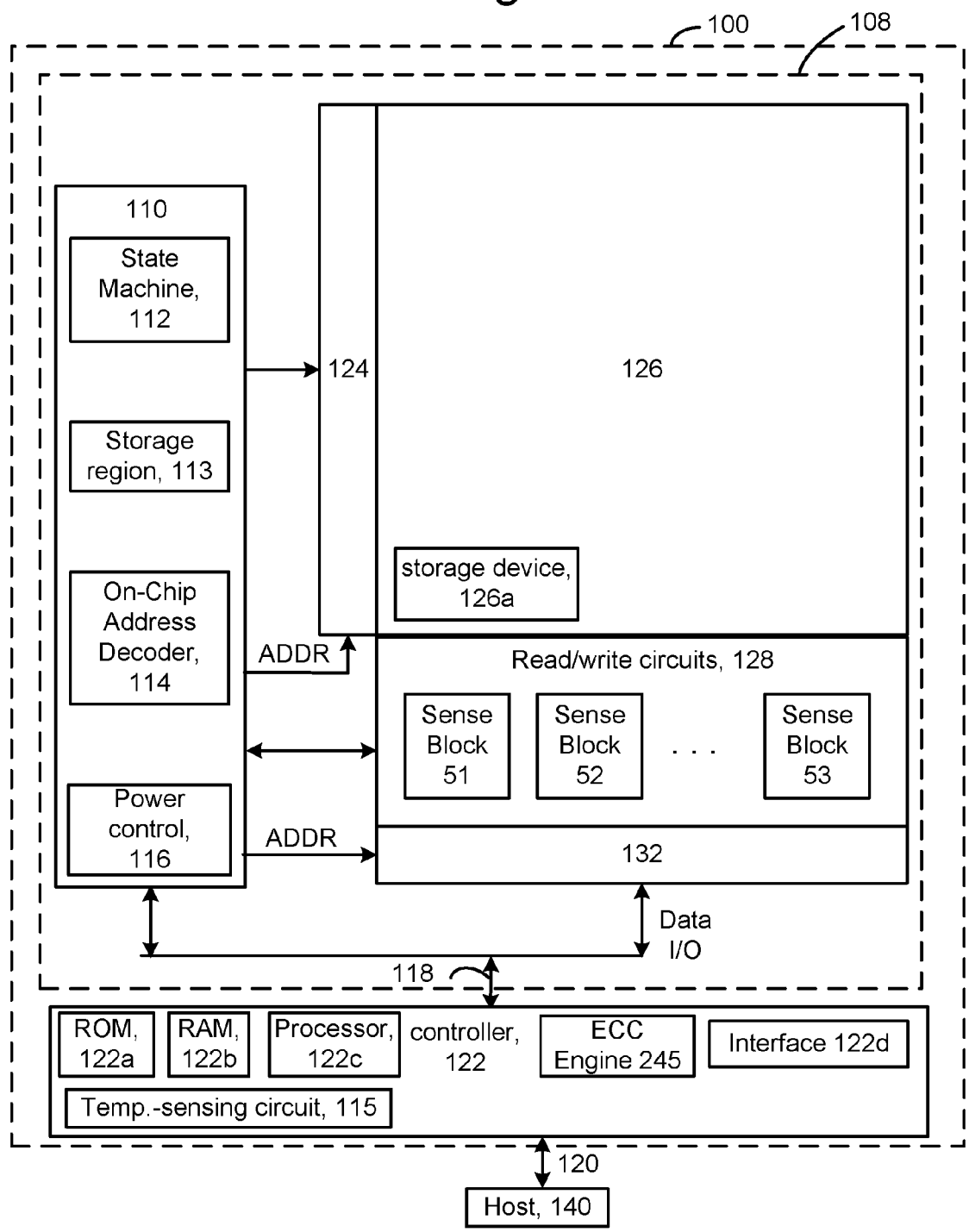
FIG. 1A is a block diagram of an example memory device.

Apparatuses and techniques are described for equalizing erase depth in different blocks of memory cells.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 8). In a three-bit per cell memory device, there are eight data states including the erased state and seven higher data states referred to as the A, B, C, D, E, F and G data states. In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When new data is to be written to a block, the block is erased. This involves boosting the channel voltage while holding the control gates of the memory cells at a low voltage such as 0 V. Various approaches can be used to boost the channel voltage. One approach raises the voltage of a substrate at a source end of the memory strings. Additionally, the control gate voltage of a source side select gate transistor of each memory string is elevated to allow holes (positive charges) to enter the channel. Another approach generates holes at the source and/or drain side select gate transistors using gate-induced drain leakage (GIDL). However, the erase depth for different blocks can vary based on a distance of the block from a pass gate of a select gate voltage source.

In particular, a transient coupling up of the control gate voltage of a select gate transistor has been observed due to charging up of the channel voltage. This coupling up is discharged via the pass gates. But, since the different blocks have different distances from the pass gates, the discharge time will be longer for the blocks that are further. The further blocks will experience a shallower erase because the select gate remains coupled up for a longer period. The coupled up state of the control gate of the select gate results in a lower channel-to-control gate voltage of the select gate, so that fewer holes can enter the channel and charge up the channel. On the other hand, the faster decay for the closer blocks results in a deeper erase. The erase depth can be expressed in terms of an average or median Vth of the cells after an erase operation is completed, for instance. The different erase depths occur even though an erase verify test ensures that the Vth is below a verify level.

The different erase depths are problematic because they can affect the programming process. For example, cells that are erased too deeply may use additional program loops to complete programming. Cells that have a relatively shallow erase may experience more program disturb.

Techniques provided herein address the above and other issues. In one aspect, an erase operation is adjusted for a block based on a distance of the block from pass gates of a voltage source. For example, one or more voltages can be adjusted. These include an erase voltage width and/or initial level. At the source end of memory strings in a block, Vsl (source line voltage) and/or Vsgs can be adjusted. At the drain end of memory strings in a block, Vbl and/or Vsgd can be adjusted. In another approach, an additional erase pulse can be applied when the distance of the block exceeds a threshold. Adjacent groups of blocks can be assigned to subsets. The blocks of each subset can be erased in the same way, while blocks of different subsets are erased differently, to provide a simplified implementation which still provides a more uniform erase depth.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

The controller 122 may also include a temperature-sensing circuit 115 which is used by the processor 122c to determine whether to increase a magnitude or a duration of an erase voltage. See also FIGS. 1B and 16G.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
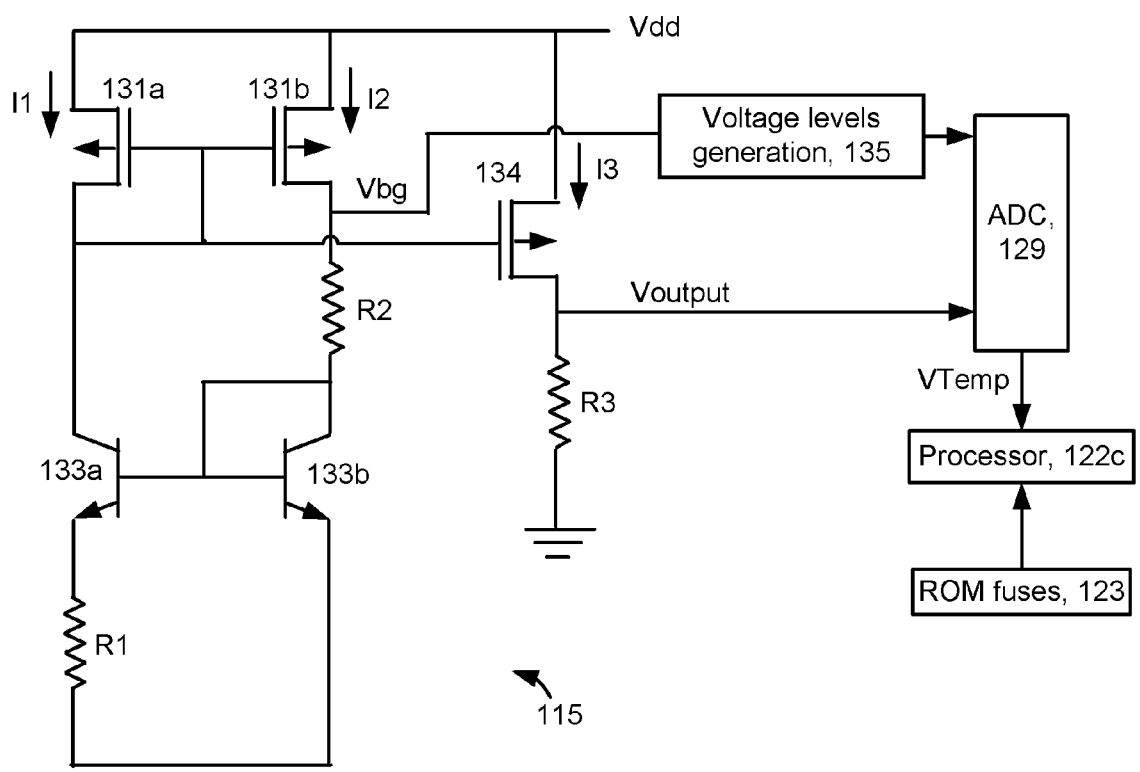
FIG. 1B depicts an example of the temperature-sensing circuit 115 of FIG. 1A.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
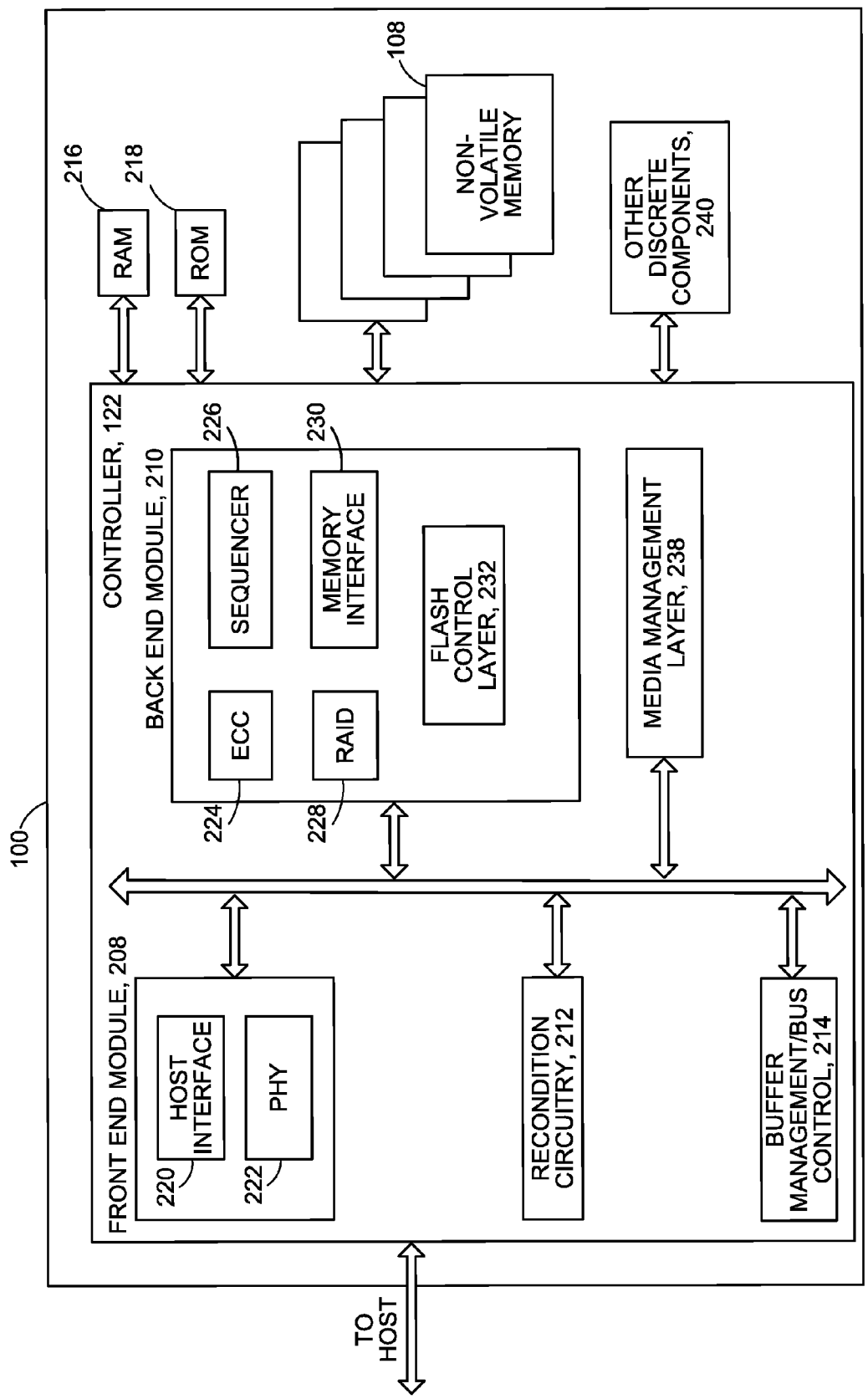
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
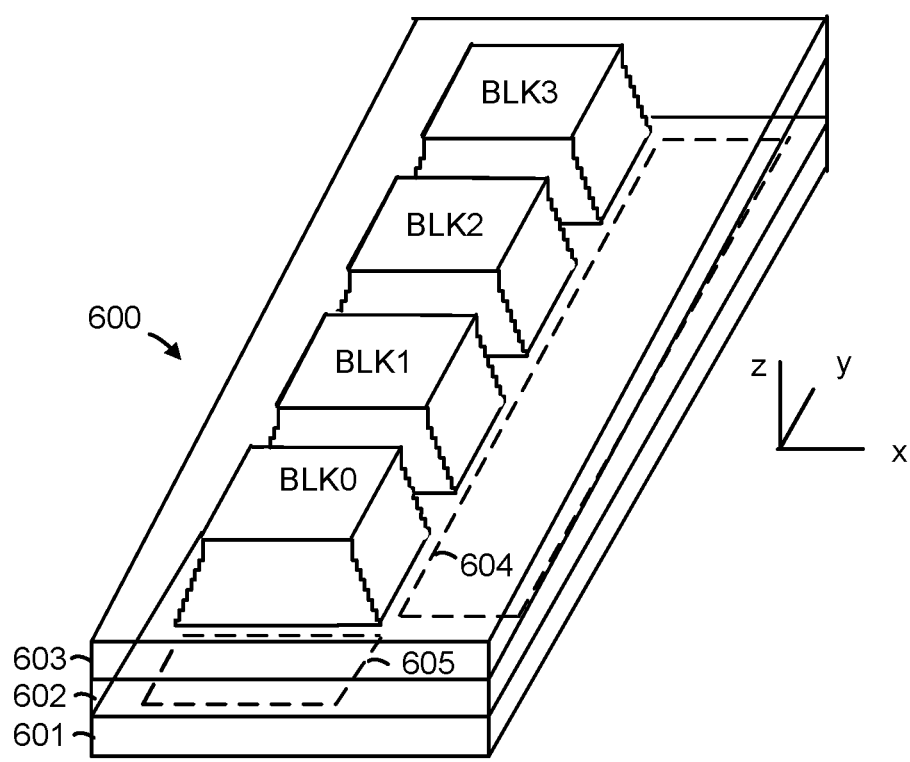
FIG. 3 is a perspective view of a memory device 600 comprising a set of blocks in an example 3D configuration of the memory structure 126 of FIG. 1A.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. The pass gates for a voltage source of the SGS transistors may be located in this peripheral area 605, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 5 depicts an example transistor 590. The transistor comprises a control gate CG, a drain D, a source S and a channel CH. During an erase operation, the transistor has a positive channel-to-control gate voltage. In the case of a memory cell transistor, the control gate voltage can be set to a low value such as 0 V so that the channel-to-control gate voltage is high enough to repel electrons from the charge trapping layer and thereby lower the Vth of the memory cell. In the case of a select gate transistor, the control gate voltage can be set to a higher value such as 10 V so that the channel-to-control gate voltage is not high enough to lower the Vth of the transistor.

Figure 6:
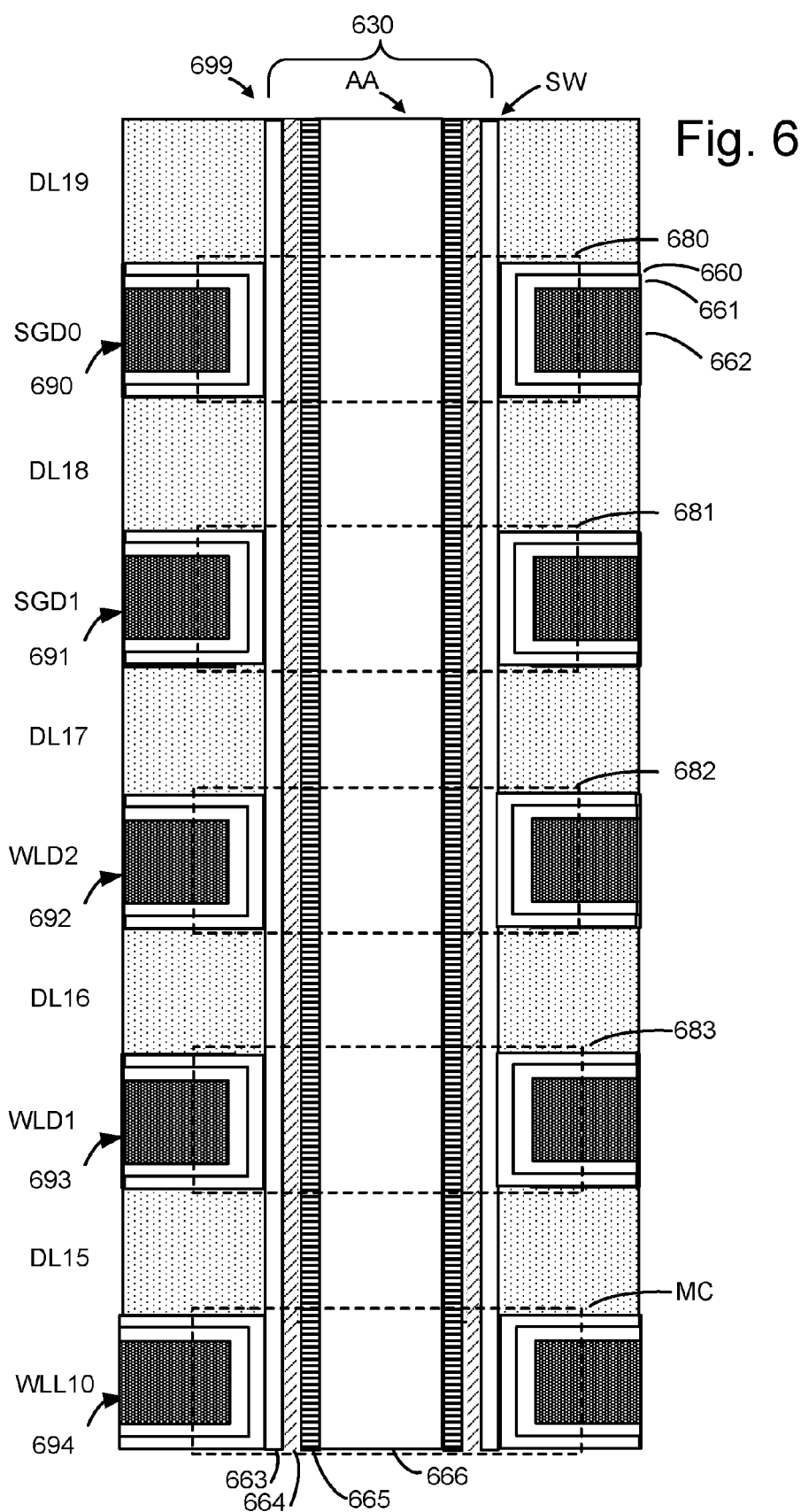
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
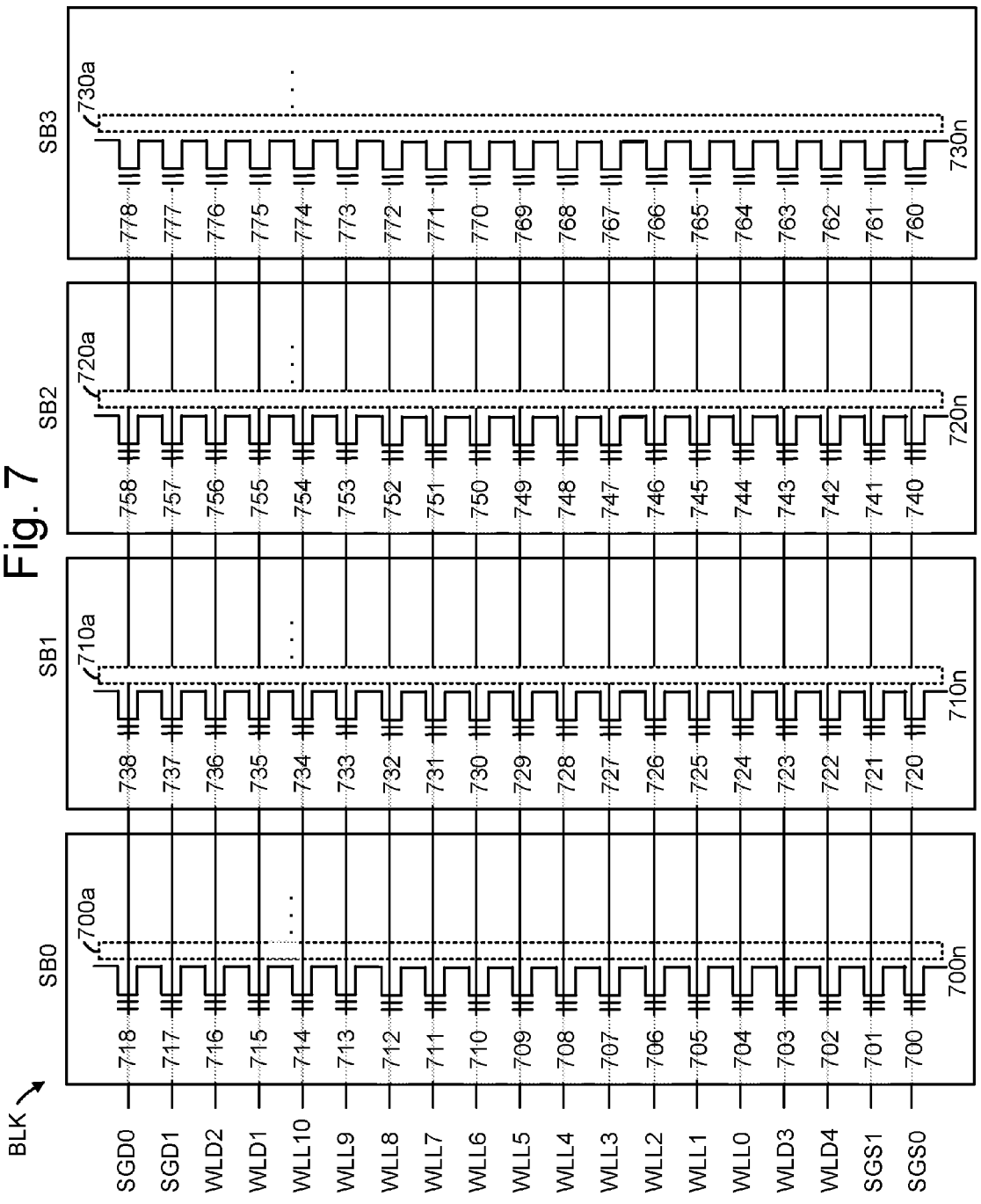
FIG. 7 depicts an example view of NAND strings in sub-blocks in a 3D configuration which is consistent with FIG. 4.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. In this example, the source line SL or source region is driven at a voltage Vsl by a voltage source, SLVS.

In another possible implementation, the source lines are separate and can be driven at respective voltages.

FIG. 9A depicts an example process for performing an erase operation in which the erase depth is equalized for different blocks. Step 900 includes deciding to perform an erase operation for a selected block. For example, the controller 122 may decide to erase a block when the data stored in the block is no longer needed. The controller may act in response to a user command from the host, or based on its own decision making process. Step 901 includes deciding how to perform the erase operation based on a distance of the selected block from the pass gate of a voltage source. This can include deciding to perform a shallower erase for a close block and/or a deeper erase for a far block. For example, step 903 includes adjusting one or more voltages. This can include one or more of steps 905, 906 and 907. Step 905 includes setting an erase voltage width and/or initial level based on distance. Step 906 includes, at the source end of the memory strings in the block, setting Vsl and/or Vsgs based on the distance. Step 907 includes, at the drain end of the memory strings in the block, setting Vbl (bit line voltage) and/or Vsgd based on the distance. Step 904 includes setting the erase mode. For example, this can involve deciding whether to apply an additional erase voltage without a verify test. Step 902 includes performing the erase operation.

FIG. 9B depicts an example table for implementing the process of FIG. 9A. The table can cross-reference a block identifier of each block, e.g., BLK_0 to BLK_8, to a respective subset, e.g., subset0, subset1 or subset2. Subset0 can represents blocks which are relatively close to the pass gate of an erase voltage source, such as BLK_0 to BLK_3. Subset1 can represents blocks which are midrange relative to the pass gate, such as blocks BLK_4 to BLK_6. Subset2 can represents blocks which are relatively far from the pass gate, such as BLK_7 and BLK_8. See also FIG. 21B which is consistent with this table.

In one approach, the number of blocks in a subset is progressively smaller as the distance is progressively larger. This is because the slower decay of the select gate voltage for the far blocks may be a non-liner function of the distance. Each block or subset can be cross-referenced to one or more erase voltages depicted generically here as V0, V1 and V2 and to an erase mode depicted generically here as Mode0, Mode1 and Mode2. V0, V1 and V2 could represent, e.g., one or more of Vsl, Vsgs, Vbl, Vsgd, Ver_init, Ver pulse duration and the Ver step size. Voltage magnitudes and erase voltages can be referenced in the table, which can be stored in the storage region 113 of FIG. 1A, for example.

An erase mode such as Mode2 for the far blocks can apply an additional erase voltage without a verify test, after the erase verify test is passed by a block. In one example, Mode0 and Mode1 are the same and involve not applying an additional erase voltage, while Mode2 involves applying an additional erase voltage without a verify test. In another example, Mode0 involves not applying an additional erase voltage, Mode1 involves applying an additional short duration erase voltage, and Mode2 involves applying an additional longer duration erase voltage. Other options are possible as well. For example, the different modes can involve a GIDL erase or a non-GIDL erase, charging of the channel from the source side only, the drain side only, or both source and drain sides, and so forth. In one example, the far blocks are erased using charging of the channel from both the source and drain ends while the close blocks are erased using charging of the channel from the source or drain end, but not both ends. This compensates for the shallower erase of the far blocks which would otherwise occur.

FIG. 10 depicts an example process for performing an erase operation consistent with step 902 of FIG. 9A. Step 1010 sets an initial erase voltage (Ver) to, e.g., a baseline level of Ver_init, a low level of Ver_init_low or a high level of Ver_init_high. See, e.g., FIGS. 14A, 14C, 14D, 14E and 16A. Step 1011 includes charging up (increasing the voltage of) channels of the memory strings from source and/or drain ends, and setting a low voltage such as 0 V on the word lines (control gates) of the memory cells. Step 1012 includes performing an erase verify test for a block. Typically, this involves setting an erase verify voltage VvEr to the word lines while sensing a current in the memory strings. If the current is sufficiently high, the string is considered to pass the verify test. The block in turn passes the verify test if all, or nearly all, of the strings pass the verify test. If the block passes the erase verify test at decision step 1013, either the erase operation is completed, at step 1016, or an additional erase voltage is applied at step 1014, without a verify test, and the erase operation is completed, at step 1016. If the block does not pass the erase verify test at decision step 1013, Ver may be incremented at step 1015 and a next erase loops occurs at step 1011. An erase loop typically involves applying erase voltages followed by performing a verify test, although in some cases the verify test is omitted.

Figure 11A:
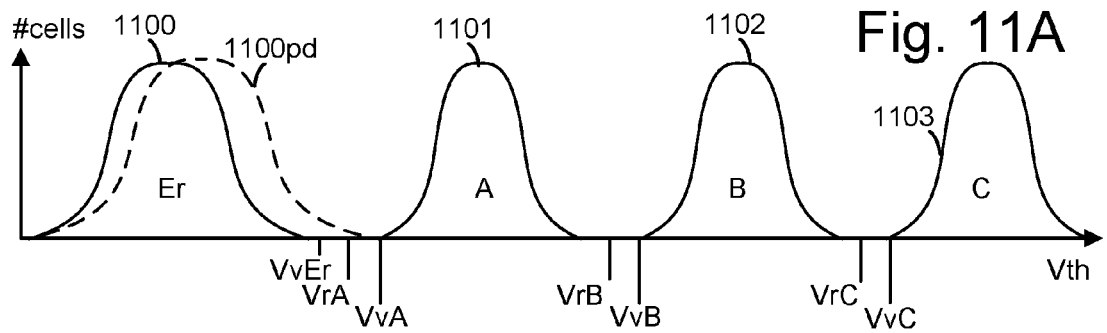
FIG. 11A depicts an example threshold voltage (Vth) distribution of a set of memory cells connected to a word line, after a programming operation, where four data states are used.

FIG. 11A depicts an example threshold voltage (Vth) distribution of a set of memory cells connected to a word line, after a programming operation, where four data states are used. A Vth distribution 1100 is provided for erased (Er) state memory cells. Three Vth distributions 1101, 1102 and 1103 represent assigned data states A, B and C, respectively, which are reached by memory cells when their Vth exceeds the erase-verify voltage VvA, VvB or VvC, respectively. This example uses four data states. Other numbers of data states can be used as well, such as eight or sixteen. Read voltages VrA, VrB and VrC are used to read data from a set of cells having this Vth distribution.

A Vth distribution 1100pd represents the erased state cells after they experience program disturb. This results in the upper tail of the distribution increasing above VvEr and potentially above VrA, leading to read errors.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Figure 11B:
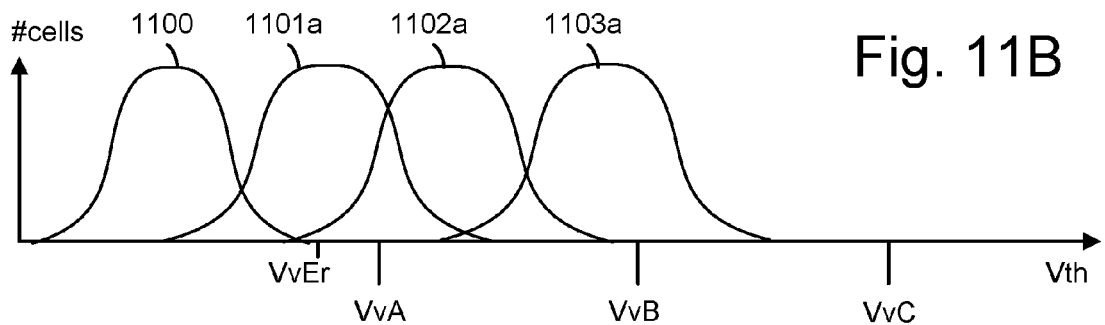
FIG. 11B depicts a Vth distribution of a set of memory cells after a first erase loop in an erase operation, consistent with FIG. 10.

FIG. 11B depicts a Vth distribution of a set of memory cells after a first erase loop in an erase operation, consistent with FIG. 10. This example erase operation uses three erase loops to complete programming. Each successive program voltage causes the Vth of the programmed cells to decrease toward the erased state Vth distribution 1100. The Vth distributions 1101a, 1102a and 1103a represent the A, B and C states, respectively.

Figure 11C:
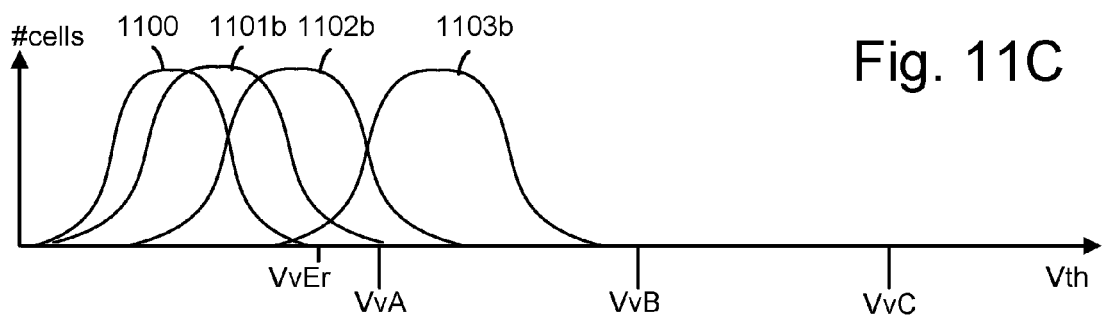
FIG. 11C depicts a Vth distribution of a set of memory cells after a second erase loop in the erase operation.

FIG. 11C depicts a Vth distribution of a set of memory cells after a second erase loop in the erase operation. The Vth distributions 1101b, 1102b and 1103b represent the A, B and C states, respectively.

Figure 11D:
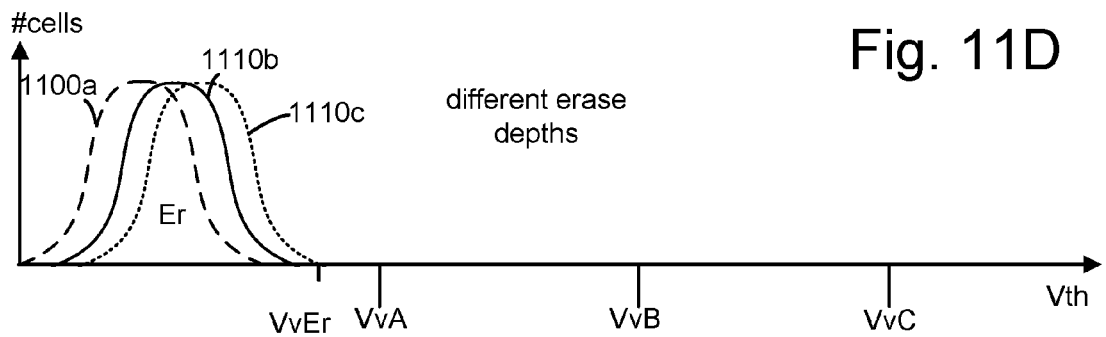
FIG. 11D depicts a Vth distribution of a set of memory cells after a third and final erase loop in the example erase operation, where different erase depths are seen for different blocks.

FIG. 11D depicts a Vth distribution of a set of memory cells after a third and final erase loop in the example erase operation, where different erase depths are seen for different blocks. The erased state Vth distributions 1100a, 1110b and 1110c represent blocks which are close, midrange or far, respectively, from the pass gate of the voltage source of an erase voltage. Although the erase verify test may be passed by each block after the same number of erase loops, e.g., three erase loops, the erase depth differs based on the block's location. The close blocks are more deeply erased than the midrange blocks, and the midrange blocks are more deeply erased than the far blocks, which are the least erased. Due to the goal of erasing a block after a small number of erase loops, the erase depth can differ for different blocks. One solution to providing a more uniform erase depth is to adjust the erase process to provide a deeper erase for the midrange and/or far blocks. Another approach is to adjust the erase process to provide a shallower erase for the close blocks. Both of these approaches may be used as well.

The overall erase state Vth distribution will comprise the sum of the individual distributions of the programmed state cells and the erased state cells of a block.

Figure 11E:
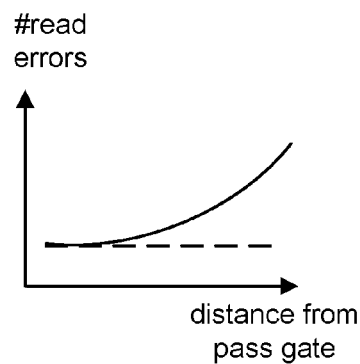
FIG. 11E depicts a plot of read errors versus distance from pass gate.

FIG. 11E depicts a plot of read errors versus distance from pass gate. The solid line corresponds to the Vth distributions of FIG. 11D. This line shows that the number of read errors increases sharply for the far blocks, which have a shallower erase depth, if no corrective action is taken to equalize the erase depths. With a shallower erase, the upper tail of the erased state Vth distribution is higher and closer to exceeding VrA. A given increase in Vth due to program disturb results in a significant increase in read errors.

Figure 12A:
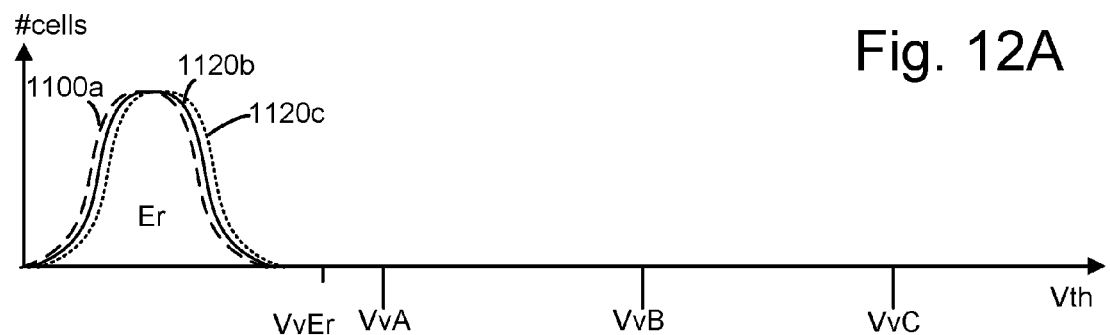
FIG. 12A depicts a Vth distribution of a set of memory cells after an erase operation in which the midrange and far blocks are erased more deeply than in FIG. 11D.
Figure 12B:
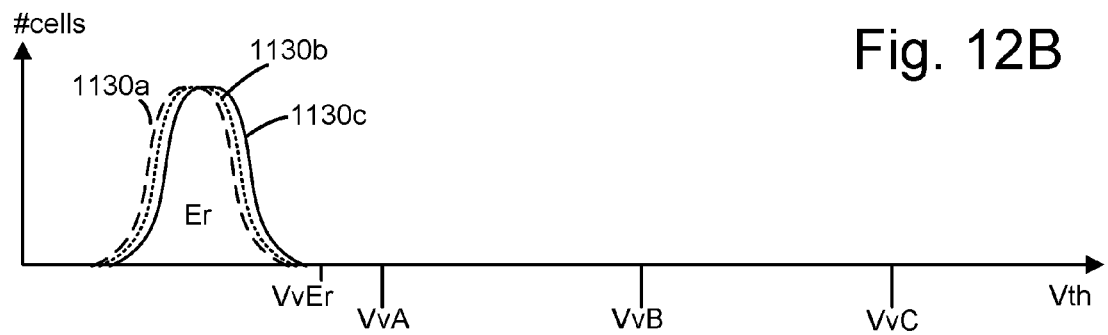
FIG. 12B depicts a Vth distribution of a set of memory cells after an erase operation in which all blocks have a narrower Vth distribution than in FIG. 11D.

The dashed line corresponds to the Vth distributions of FIG. 12A or 12B, where a corrective action is taken to equalize the erase depths for the different blocks.

FIG. 12A depicts a Vth distribution of a set of memory cells after an erase operation in which the midrange and far blocks are erased more deeply than in FIG. 11D. Various approaches described herein can increase the erase depth, such as increasing the magnitude and/or duration of erase voltages such as Vsl. The Vth distribution 1100a is the same as in FIG. 11D. The Vth distributions 1120b and 1120c correspond to the Vth distributions 1110b and 1110c, respectively, of FIG. 11D, but are shifted lower. Moreover, the shift is greater for the distribution 1120c (far blocks) than for the distribution 1120b (midrange blocks).

As an alternative or addition to adjusting the erase depth for blocks based on their distance from a pass gate of an erase voltage source, it is possible to adjust the erase verify voltage and/or the verify voltage of one or more programmed data states. For example, referring to FIG. 11D, the verify voltages of the programmed data states including VvA can be lowered for the blocks that are more deeply erased, such as the blocks represented by the Vth distribution 1100a. This can provide a uniform margin between the upper tail of the Vth distribution of the erased state and VvA, the verify level of the lowest programmed data state. This helps provide a uniform program disturb margin for the different blocks. Although, providing a uniform erase depth is advantageous because it does not require subsequent adjustments during programming.

FIG. 12B depicts a Vth distribution of a set of memory cells after an erase operation in which all blocks have a narrower Vth distribution than in FIG. 11D. The Vth distributions 1130a, 1130b and 1130c represent the A, B and C data states, respectively, at the completion of the erase operation. One approach to achieving narrower Vth distributions is to use more erase verify loops. This can involve using a lower Ver initial, a lower Ver step size and/or a shorter erase voltage. This results in a more gentle reduction in the Vth levels with each erase verify loop, which keeps the Vth distributions narrower. Potentially, the upper tails of the Vth distributions may be closer to VvEr after the erase operation is completed than in FIG. 11D. However, the spacing between VvEr and VvA can be set to provide sufficient program disturb margin.

Figure 13A:
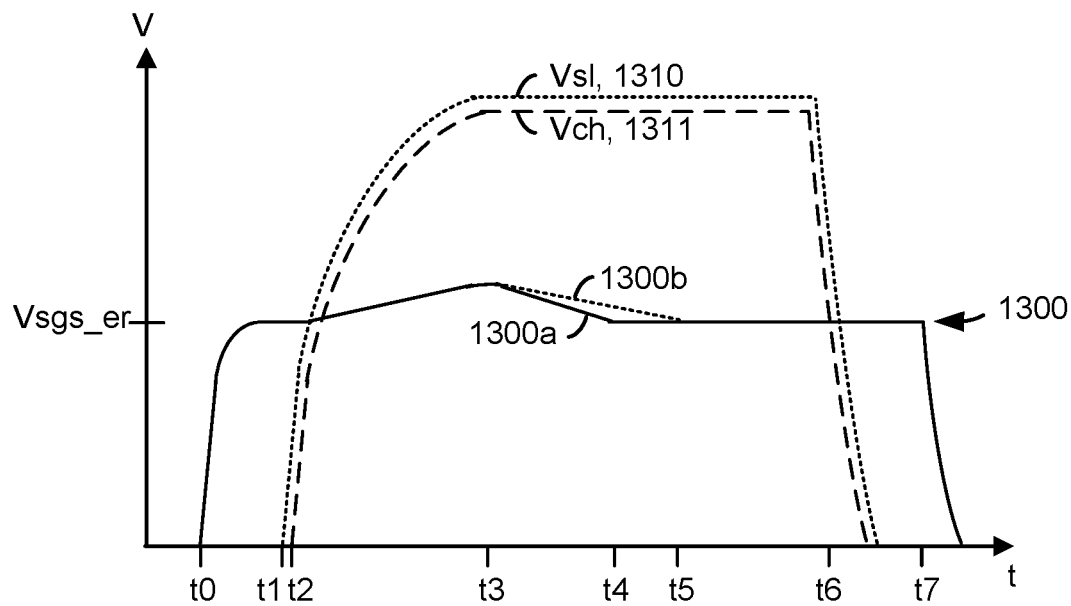
FIG. 13A depicts a plot of voltages in an example erase operation, consistent with FIG. 10.
Figure 13B:
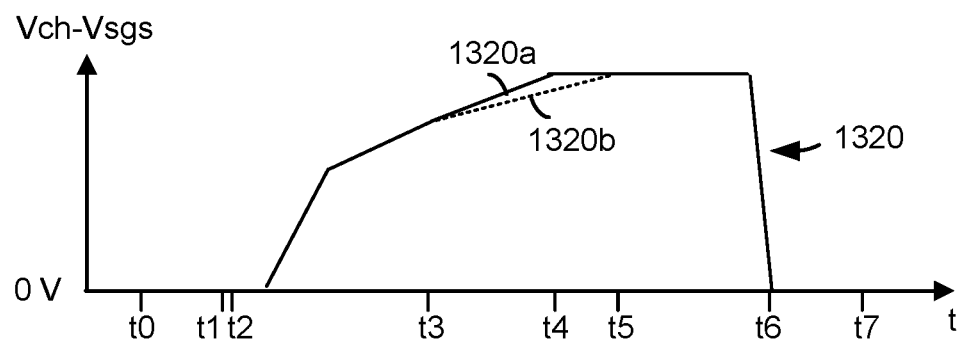
FIG. 13B depicts a plot of Vch-Vsgs in an example erase operation, consistent with FIG. 13A.

FIG. 13A depicts a plot of voltages in an example erase operation, consistent with FIG. 10. In FIGS. 13A and 13B, the vertical axis depicts voltage and the horizontal axis depicts time. The horizontal axes of FIGS. 13A and 13B are time aligned. One example erase operation involves injecting holes into the channel of the memory strings from the source end of the strings. This involves applying a voltage Vsl to the source ends via the substrate as depicted by a waveform 1310. The channel voltage Vch follows Vsl, as depicted by the waveform 1311. The waveform 1300 depicts Vsgs. In one option, waveform portion 1300a is followed by blocks which are close to the pass gate of the Vsgs voltage source and waveform portion 1300b is followed by blocks which are far from the pass gate of the Vsgs voltage source.

Specifically, at a time t0, Vsgs is raised from 0 V to an erase level Vsgs_er, e.g., 10 V, which is the voltage output by the voltage source. Starting at time t1 and t2, Vsl and Vch, respectively, begin to increase at a rate which is typically slower than the rate of increase of Vsgs. As Vch increases, it tends to increase Vsgs due to a transient capacitive coupling from the channel to the control gate of the SGS transistor. For example, Vsgs could be increased to 11-12 V. When Vsl and Vch stabilize at their peak levels at t3, e.g., 20-25 V, the conditions for the coupling no longer exist. At this time, Vsgs will gradually discharge through the pass gates and return to the commanded level of Vsgs_er. However, this discharge time will be larger for the far blocks (e.g., t5-t3) than for close blocks (e.g., t4-t3) due to the larger distance and RC time constant of the control line which extends from the substrate to the pass gate. See FIG. 21A to 21C. The transient increase in Vsgs temporarily reduces the amount of holes that can enter the channel, so that a shallower erase results for the far blocks. This can be seen by referring to FIG. 13B.

Thus, the close blocks will have an improved ability to pass a hole current into the channel, so that these channels are charged up faster and have a faster erase speed, if the compensating techniques proved herein are not used.

FIG. 13B depicts a plot of Vch-Vsgs in an example erase operation, consistent with FIG. 13A. As mentioned, Vch is the channel voltage and Vsgs is the actual control gate voltage of the SGS select gate. The difference between these two corresponds to the amount of holes which can enter and charge up the channel. A waveform 1320 includes a portion 1320a which corresponds to the portion 1300a in FIG. 13A and which represents the close blocks. Portion 1320b corresponds to the portion 1300b in FIG. 13A and represents the far blocks. Since Vch-Vsgs is temporarily lower for the far blocks compared to the close blocks, the erase is shallower for the far blocks. With the techniques provides herein, this situation is compensated to provide a uniform erase depth for the different blocks. For instance, the magnitude and/or duration of Vsgs or other erase voltages can be decreased for the far blocks to increase Vch-Vsgs.

Figure 14A:
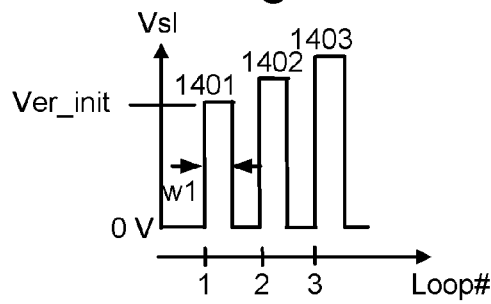
FIG. 14A depicts a plot of example erase voltages applied to a source line for a close block, where a baseline pulse width w1 and a baseline initial erase voltage Ver_init are used.

FIG. 14A depicts a plot of example erase voltages applied to a source line for a close block, where a baseline pulse width w1 and a baseline initial erase voltage Ver_init are used. The vertical axis depicts Vsl and the horizontal axis depicts the erase loop number, in FIGS. 14A, 14C, 14D, 14E, 15A and 16A. The erase voltage Vsl has an initial magnitude of Ver_init and steps up in magnitude in each successive erase loop. A total of three loops are used to complete the erase operation in this example. Erase voltages 1401, 1402 and 1403 are applied in the erase loops 1, 2 and 3, respectively.

Figure 14E:
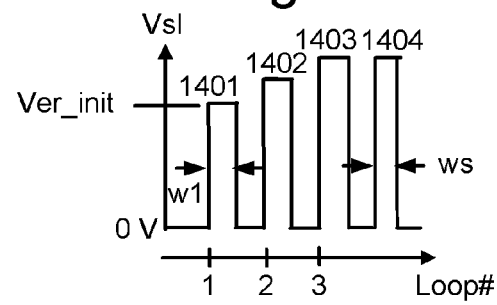
FIG. 14E depicts the plot of FIG. 14A modified for use by a far block by an additional erase voltage 1404 to provide a deeper erase.
Figure 14B:
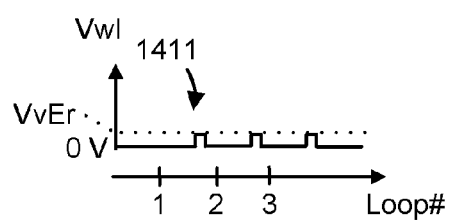
FIG. 14B depicts a plot of verify voltages applied to word lines in a block, consistent with the example of FIG. 14A.

FIG. 14B depicts a plot of verify voltages applied to word lines in a block, consistent with the example of FIG. 14A. The vertical axis depicts Vwl (word line voltage) and the horizontal axis depicts the erase loop number, in FIGS. 14B and 15B. An example erase verify voltage 1411 is depicted. This voltage (VvEr) may have a magnitude near 0 V, for example. An erase verify voltage is typically applied after each erase voltage as part of an erase verify test of a block.

Figure 14C:
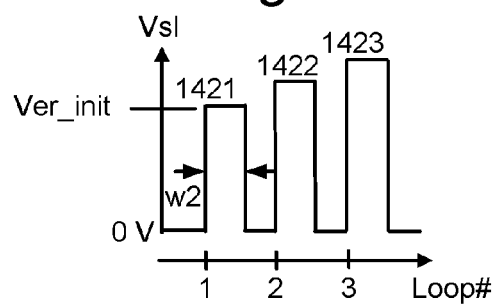
FIG. 14C depicts a plot of example erase voltages applied to a source line for a far block, where a large pulse width w2>w1 and a baseline initial erase voltage Ver_init are used to provide a deeper erase.

FIG. 14C depicts a plot of example erase voltages applied to a source line for a far block, where a large pulse width w2>w1 and a baseline initial erase voltage Ver_init are used to provide a deeper erase. The initial erase voltage is the same as in FIG. 14A but the pulse width is larger. As a result, each erase voltage has a stronger erase effect, so that the Vth of the far blocks is lowered to the level of the close blocks, as depicted in FIG. 12A. As before, a total of three loops are used to complete the erase operation in this example. Erase voltages 1421, 1422 and 1423 are applied in the erase loops 1, 2 and 3, respectively.

Figure 14D:
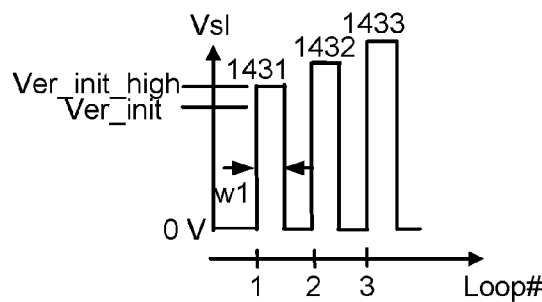
FIG. 14D depicts a plot of example erase voltages applied to a source line for a far block, where a baseline pulse width w1 and a high initial erase voltage Ver_init_high are used to provide a deeper erase.

FIG. 14D depicts a plot of example erase voltages applied to a source line for a far block, where a baseline pulse width w1 and a high initial erase voltage Ver_init_high are used to provide a deeper erase. One way to provide a deeper erase is to increase Ver_init compared to the example of FIG. 14A. The step size between erase voltages can also be increased to provide a deeper erase, with or without the increase in Ver_init. As before, a total of three loops are used to complete the erase operation in this example. Erase voltages 1431, 1432 and 1433 are applied in the erase loops 1, 2 and 3, respectively. Erase verify voltages similar to FIG. 14B can be used.

FIG. 14E depicts the plot of FIG. 14A modified for use by a far block by an additional erase voltage 1404 to provide a deeper erase. The erase voltages 1401, 1402 and 1403 of FIG. 14A are repeated in the first, second and third erase loops, respectively, while the additional erase voltage 1404 is provided in the fourth loop. Each erase voltage may have the same duration w1, in one approach. Or, the additional program voltage 1404 may have a different duration, perhaps a smaller duration than the other voltages (as depicted here by the duration ws<w1). The purpose of the additional program voltage is to provide a small amount of additional erasing (Vth lowering) for the far blocks. The additional erase voltage can be applied after the cells of the far block pass the erase verify test, as noted at step 1014 of FIG. 10, so that no additional verify test is used. The waveform of FIG. 14B can thus be used with the example of FIG. 14E.

In an example implementation, a control circuit, to perform an erase operation, is configured to provide a series of erases voltages 1401-1403 to a selected block and to perform a verify test after each erase voltage, wherein after the verify test is passed, the control circuit is configured to provide an additional erase pulse 1404 to the selected block if the distance exceeds a threshold. The distance exceeds a threshold when the block is relatively far from the pass gates. For example, the distance exceeds a threshold if the block is in a subset of blocks which is furthest from the pass gates.

Figure 15A:
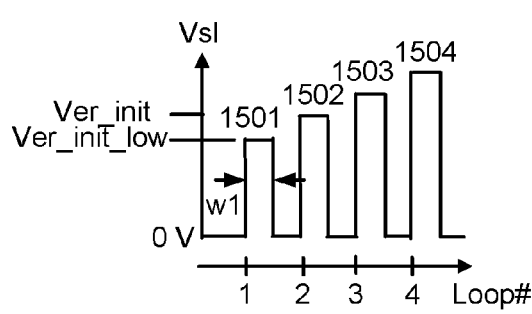
FIG. 15A depicts a plot of example erase voltages applied to a source line for a close block, where a baseline pulse width w1 and a low initial erase voltage Ver_init_low are used to provide a shallower erase.

FIG. 15A depicts a plot of example erase voltages applied to a source line for a close block, where a baseline pulse width w1 and a low initial erase voltage Ver_init_low are used to provide a shallower erase. Compared to FIG. 14A, the initial erase voltage is lower. A result of this is that four erase loops are used instead of three to complete the erase operation. This assumes the same step size is used as in FIG. 14A. Another option to obtain a narrower Vth distribution of the erased state is to use a smaller step size. Thus, another alternative to FIG. 14A is to use the same Ver_init but a smaller step size, e.g., for Vsl.

The erase voltage Vsl has an initial magnitude of Ver_init_low and steps up in magnitude in each successive erase loop. Erase voltages 1501, 1502, 1503 and 1504 are applied in the erase loops 1, 2, 3 and 4, respectively.

Figure 15B:
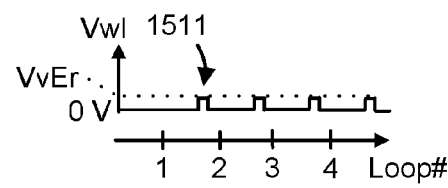
FIG. 15B depicts a plot of verify voltages applied to word lines in a block, consistent with the example of FIG. 15A.

FIG. 15B depicts a plot of verify voltages applied to word lines in a block, consistent with the example of FIG. 15A. An example erase verify voltage 1511 is depicted.

Figure 16A:
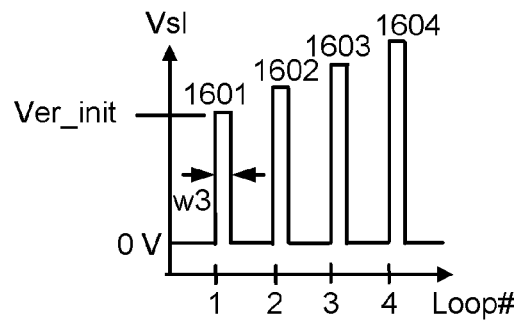
FIG. 16A depicts a plot of example erase voltages applied to a source line for a close block, where a small pulse width w3<w1 and a baseline initial erase voltage Ver_init are used to provide a shallower erase.

FIG. 16A depicts a plot of example erase voltages applied to a source line for a close block, where a small pulse width w3<w1 and a baseline initial erase voltage Ver_init are used to provide a shallower erase. The erase voltage Vsl has an initial magnitude of Ver_init and steps up in magnitude in each successive erase loop. The steps size may be the same as in FIG. 14A, in one approach. A total of four loops are used to complete the erase operation in this example. Erase voltages 1601, 1602, 1603 and 1604 are applied in the erase loops 1, 2, 3 and 4, respectively. A result of using shorter duration erase voltages is that four erase loops are used instead of three. A corresponding verify voltage waveform is provided in FIG. 15B.

Figure 16B:
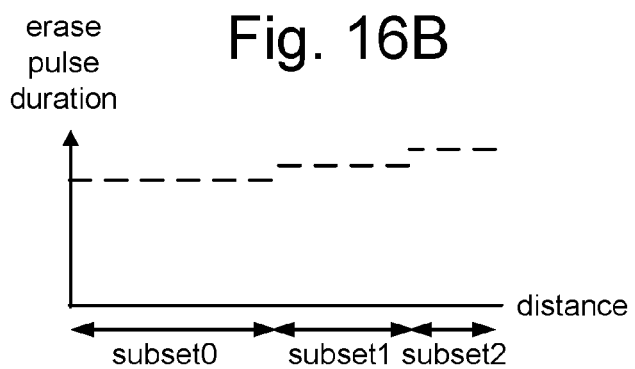
FIG. 16B depicts a plot of an erase pulse duration versus the distance of a subset of blocks from the pass gate of a voltage source, where the duration increases with the distance.

FIG. 16B depicts a plot of an erase pulse duration versus the distance of a subset of blocks from the pass gate of a voltage source, where the duration increases with the distance. The duration of the pulse width is thus an increasing function of distance. The duration is lowest for subset0, the close subset of blocks, midrange for subset1, the midrange subset of blocks, and highest for subset2, the far subset of blocks. The optimum duration can be determined by testing. By increasing the erase voltage duration, a deeper erase can be provided for the far blocks.

Figure 16C:
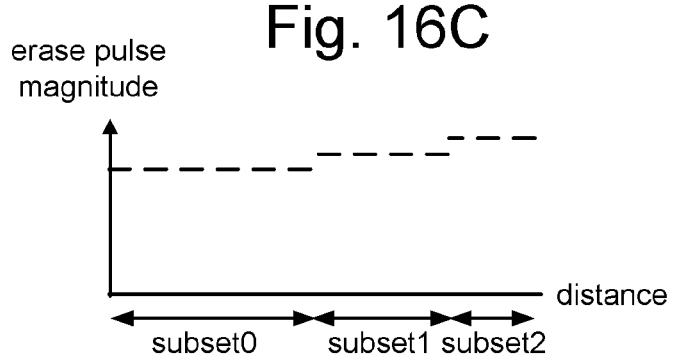
FIG. 16C depicts a plot of an erase pulse magnitude versus the distance of a subset of blocks from the pass gate of a voltage source, where the magnitude increases with the distance.

FIG. 16C depicts a plot of an erase pulse magnitude versus the distance of a subset of blocks from the pass gate of a voltage source, where the magnitude increases with the distance. The magnitude of the erase pulse is thus an increasing function of distance. The magnitude is lowest for subset0, the close subset of blocks, midrange for subset1, the midrange subset of blocks, and highest for subset2, the far subset of blocks. The optimum magnitude can be determined by testing. By increasing the erase voltage magnitude, a deeper erase can be provided for the far blocks. It is also possible to provide both the erase voltage magnitude and duration as an increasing function of distance.

Figure 16D:
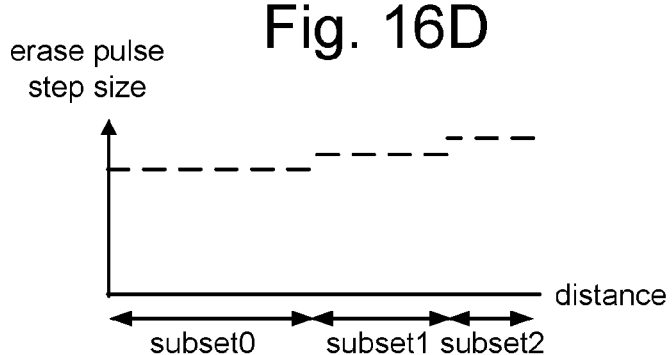
FIG. 16D depicts a plot of an erase pulse step size versus the distance of a subset of blocks from the pass gate of a voltage source, where the step size increases with the distance.
Figure 16E:
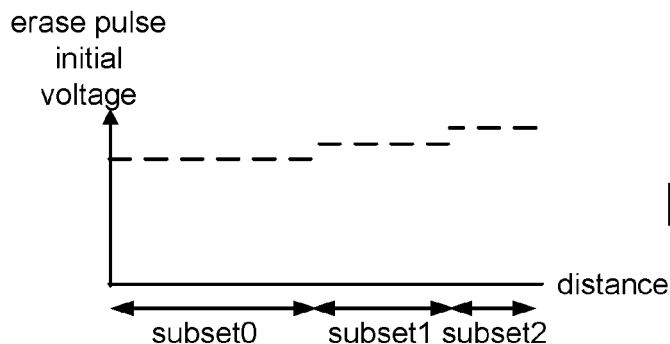
FIG. 16E depicts a plot of an erase pulse initial voltage versus the distance of a subset of blocks from the pass gate of a voltage source, where the initial voltage increases with the distance.

FIG. 16D depicts a plot of an erase pulse step size versus the distance of a subset of blocks from the pass gate of a voltage source, where the step size increases with the distance. The step size is thus an increasing function of distance. A larger step size provides a deeper erase or FIG. 16E depicts a plot of an erase pulse initial voltage versus the distance of a subset of blocks from the pass gate of a voltage source, where the initial voltage increases with the distance. The initial voltage is thus an increasing function of distance. A larger initial voltage provides a deeper erase.

Figure 16F:
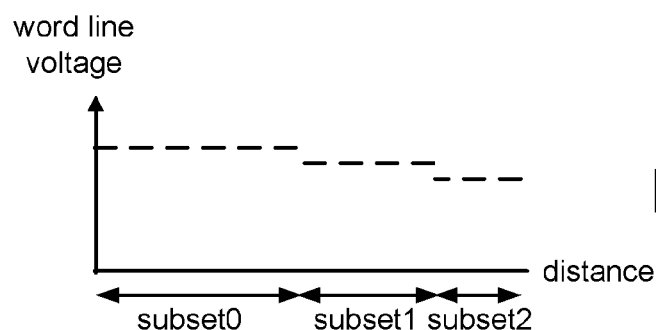
FIG. 16F depicts a plot of a word line voltage versus the distance of a subset of blocks from the pass gate of a voltage source, where the word line voltage decreases with the distance.

FIG. 16F depicts a plot of a word line voltage versus the distance of a subset of blocks from the pass gate of a voltage source, where the word line voltage decreases with the distance. A deeper erase depth can be provided by setting a lower voltage on the word lines while the channel is charged up, because the erase depth is based on the channel-to-gate voltage of the memory cells. With the gate voltage lower, the channel-to-gate voltage is higher. As noted, 0 V could be applied to the word lines during an erase operation, in one example. If negative voltages are available, a voltage such as −1 V could be applied to a word line to achieve a deeper erase. Similarly, a higher word line voltage such as 1 V could be used to achieve a shallower erase. This provides another variable for adjusting the erase depth as a function of distance.

Figure 16G:
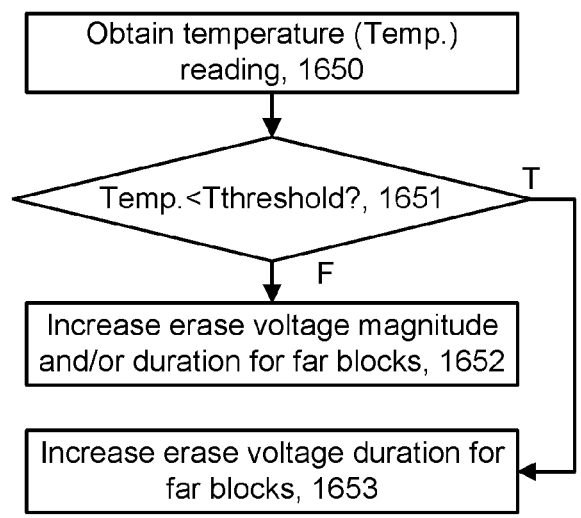
FIG. 16G depicts a method for adjusting an erase voltage as a function of temperature.

FIG. 16G depicts a method for adjusting an erase voltage as a function of temperature. When a memory device is at a relatively low temperature, it is more difficult to erase the memory cells, so a relatively high erase voltage is required to complete an erase operation. In some cases, this erase voltage may be higher than can be met by the charge pump or other voltage source. As a result, the erase voltage duration can be increased but not the magnitude for the far blocks at lower temperatures. Step 1650 obtains a temperature (Temp.) reading, such as by using the temperature sensor 115 of FIGS. 1A and 1B. Decision step 1651 performs a comparison to determine whether Temp.<Tthreshold, a threshold temperature. If decision step 1651 is true, step 1653 increases the erase voltage duration for the far blocks. If decision step 1651 is false, step 1652 increases the erase voltage magnitude and/or duration for the far blocks. In an example implementation, the erase voltage is Vsl.

In an example implementation, a control circuit is configured to set a duration of the source end voltage as an increasing function of the distance in response to a determination that a temperature is below a threshold, and to set a magnitude of the source end voltage as an increasing function of the distance in response to a determination that the temperature is above the threshold.

Figure 17:
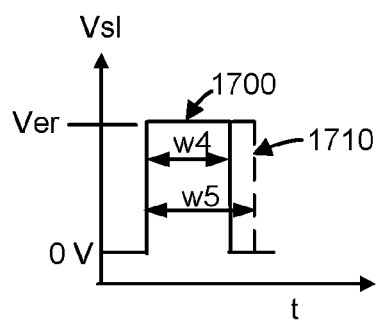
FIG. 17 depicts a plot of example erase voltages applied to a source line in an erase operation in which a single erase pulse is used with no verify test, and the example pulse width is w4 or w5.

FIG. 17 depicts a plot of example erase voltages applied to a source line in an erase operation in which a single erase pulse is used with no verify test, and the example pulse width is w4 or w5. The vertical axis depicts Vsl and the horizontal axis depicts time. In some cases, a single erase voltage can be applied to erase the cells, without performing a verify test. This type of erase operation may be sufficiently accurately although not as accurate as a multi loop erase operation with verify tests. In this case, the duration of the single erase pulse or a block can be an increasing function of the distance of the block from the pass gate of the Vsl voltage source. An erase voltage 1700 has a duration w4 and may be used for close blocks while an erase voltage 1710 has a longer duration of w5 and may be used for far blocks, to provide the desired uniform erase depth.

Figure 18A:
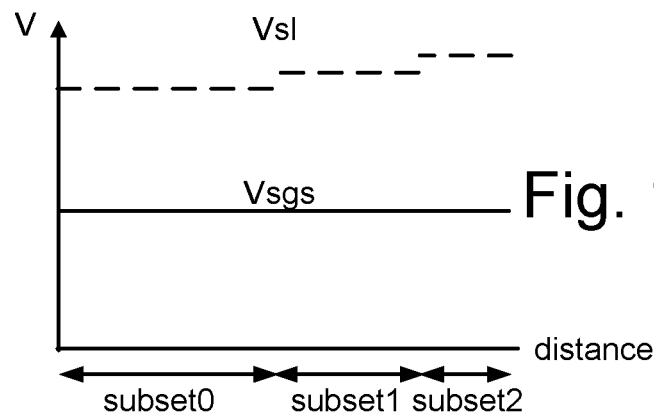
FIG. 18A depicts a plot of Vsl and Vsgs in an erase operation, where Vsl is an increasing function of distance and Vsgs is fixed.
Figure 18B:
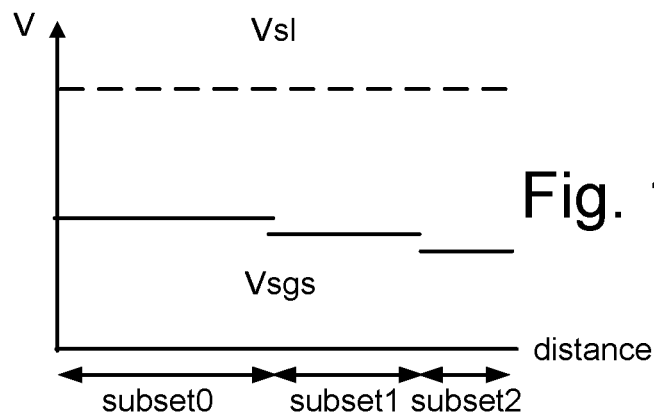
FIG. 18B depicts a plot of Vsl and Vsgs in an erase operation, where Vsl is fixed and Vsgs is a decreasing function of distance.
Figure 18C:
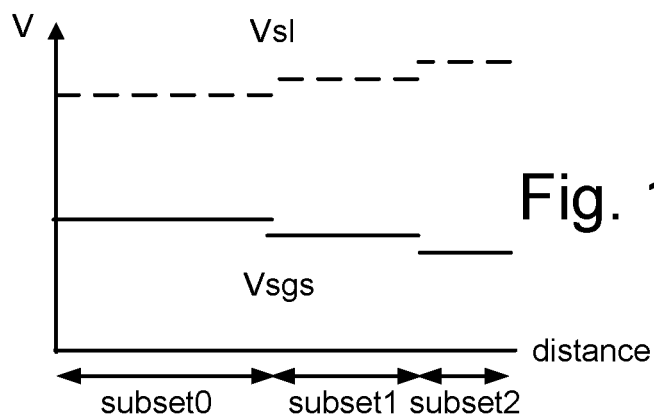
FIG. 18C depicts a plot of Vsl and Vsgs in an erase operation, where Vsl is an increasing function of distance and Vsgs is a decreasing function of distance.

FIG. 18A depicts a plot of Vsl and Vsgs in an erase operation, where Vsl is an increasing function of distance and Vsgs is fixed. In FIG. 18A-18C, the vertical axis depicts voltage and the horizontal axis depicts the distance from the subset of blocks to the pass gate. Vsl-Vsgs, which is comparable to Vch-Vsgs as in FIG. 13B, is set to be an increasing function of the distance due to the increase in Vsl, so that the erase depth of the far blocks is made equal to the erase depth of the close blocks.

FIG. 18B depicts a plot of Vsl and Vsgs in an erase operation, where Vsl is fixed and Vsgs is a decreasing function of distance. This is another way to provide Vsl-Vsgs as an increasing function of the distance. Here, the source end voltage (Vsl) is independent of the distance.

FIG. 18C depicts a plot of Vsl and Vsgs in an erase operation, where Vsl is an increasing function of distance and Vsgs is a decreasing function of distance. This is yet another way to provide Vsl-Vsgs as an increasing function of the distance.

In FIGS. 18B and 18C, Vsgs can adjusted as a function of the distance. It is also possible to adjust Vsgd similarly. A lower Vsgs and/or Vsgd helps increase the hole current into the channel as well as the hole generation rate inside the channel. This helps to charge up the channel faster and increase the erase speed.

Figure 19:
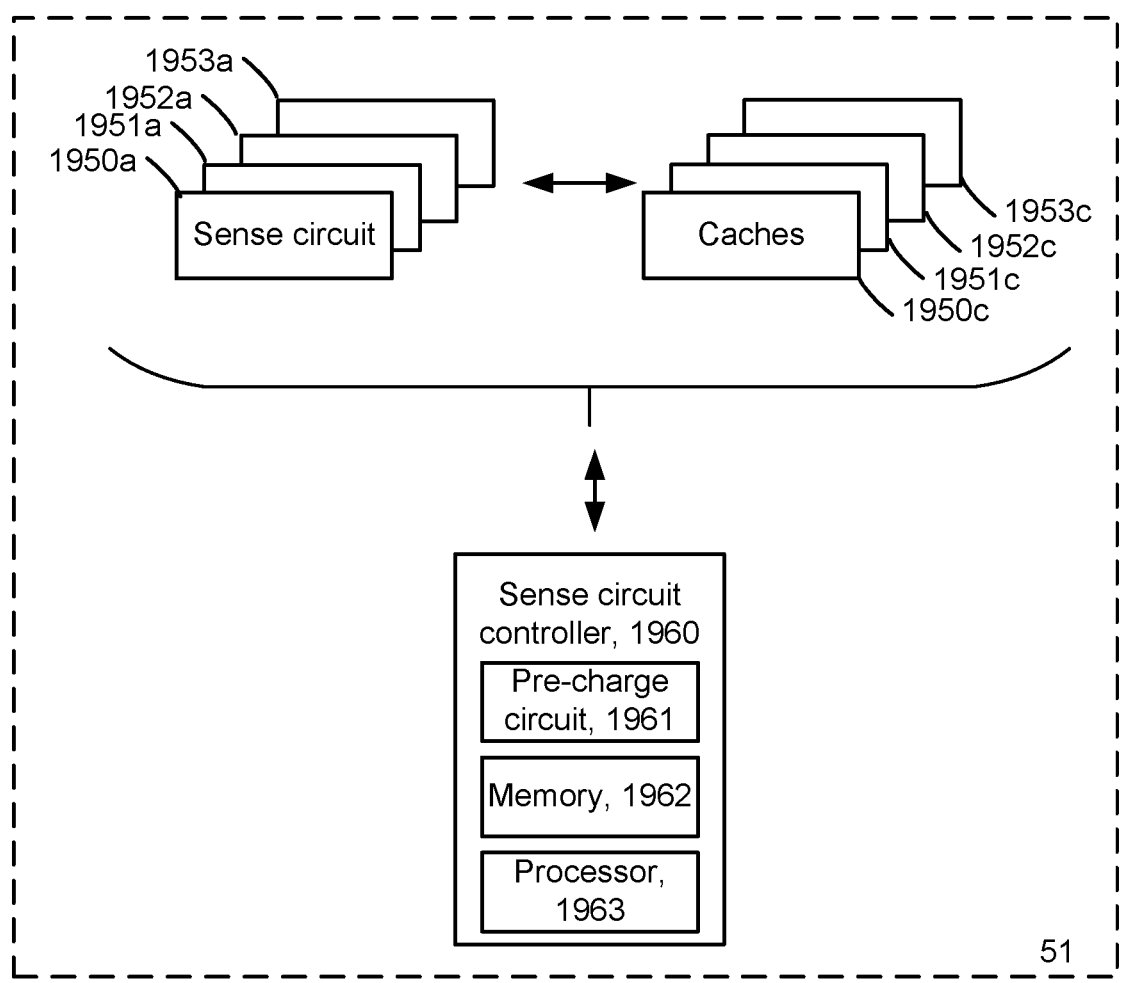
FIG. 19 depicts an example block diagram of a sense block 51 in the column control circuitry of FIG. 1A.

FIG. 19 depicts an example block diagram of a sense block 51 in the column control circuitry of FIG. 1A. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1950a, 1951a, 1952a and 1953a are associated with caches 1950c, 1951c, 1952c and 1953c, respectively.

In one approach, different subsets of bit lines can be sensed using different respective sense blocks. This allows the processing load which is associated with the sense circuits to be divided up and handled by a respective processor in each sense block. For example, a sense circuit controller 1960 can communicate with the set, e.g., sixteen, of sense circuits and latches. The sense circuit controller may include a pre-charge circuit 1961 which provides a voltage to each sense circuit for setting a pre-charge voltage. The sense circuit controller may also include a memory 1962 and a processor 1963.

Further example details of the sense circuit controller and the sense circuits are provided below.

Figure 20:
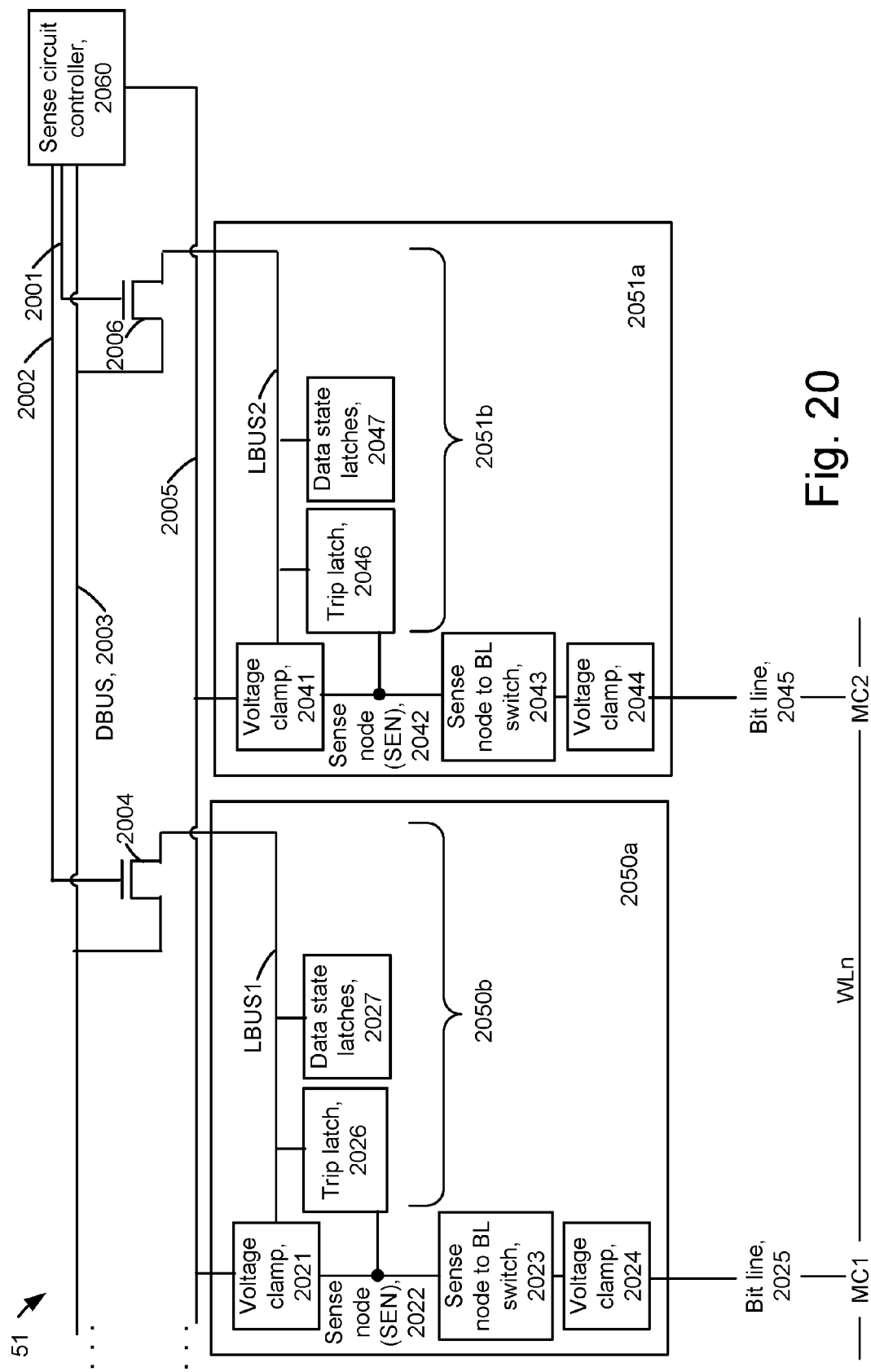
FIG. 20 depicts another example block diagram of a sense block 51 in the column control circuitry of FIG. 1A.

FIG. 20 depicts another example block diagram of a sense block 51 in the column control circuitry of FIG. 1A. The sense circuit controller 2060 communicates with multiple sense circuits including example sense circuits 2050a and 2051a. The sense circuit 2050a includes latches 2050b, including a trip latch 2026 and data state latches 2027. During a program operation, the data state latches may store the data which identifies the assigned data state of cells MC1 and MC2, which are connected to the bit lines 2025 and 2045, respectively. In case of a failure in programming data to cells of a word line, this data can be read and stored in another block, as discussed.

The sense circuit further includes a voltage clamp 2021 such as a transistor which sets a pre-charge voltage at a sense node 2022 (SEN). A sense node-to-bit line (BL) switch 2023 selectively allows the sense node to communicate with a bit line 2025, e.g., the sense node is electrically connected to the bit line so that the sense node voltage can decay. The bit line 2025 is connected to one or more memory cells, such as a memory cell MC1. A voltage clamp 2024 can set a voltage on the bit line, such as during a sensing operation or during a program voltage. A local bus, LBUS1, allows the sense circuit controller to communicate with components in the sense circuit, such as the latches 2050*b* and the voltage clamp in some cases. To communicate with the sense circuit 2050*a*, the sense circuit controller provides a voltage via a line 2002 to a transistor 2004 to connect LBUS1 with a data bus DBUS, 2003. The communicating can include sending data to the sense circuit and/or receive data from the sense circuit.

The sense circuit controller can communicate with different sense circuits in a time-multiplexed manner, for instance. A line 2005 may be connected to the voltage clamp in each sense circuit, in one approach.

The sense circuit 2051*a* includes latches 2051*b*, including a trip latch 2046 and data state latches 2047. A voltage clamp 2041 may be used to set a pre-charge voltage at a sense node 2042 (SEN). A sense node-to-bit line (BL) switch 2043 selectively allows the sense node to communicate with a bit line 2045, and a voltage clamp 2044 can set a voltage on the bit line. The bit line 2045 is connected to one or more memory cells such as a memory cell MC2. A local bus, LBUS2, allows the sense circuit controller to communicate with components in the sense circuit, such as the latches 2051*b* and the voltage clamp in some cases. To communicate with the sense circuit 2051*a*, the sense circuit controller provides a voltage via a line 2001 to a transistor 2006 to connect LBUS2 with DBUS. The lines 2001 and 2002 can be considered to be sense amplifier control lines.

The example memory cells MC1 and MC2 are connected to a selected word line WLn.

A cache may be associated with each sense circuit and connected to DBUS.

During an erase operation, the trip latches may store data which results from the erase verify test of the respective string of memory cells.

Figure 21A:
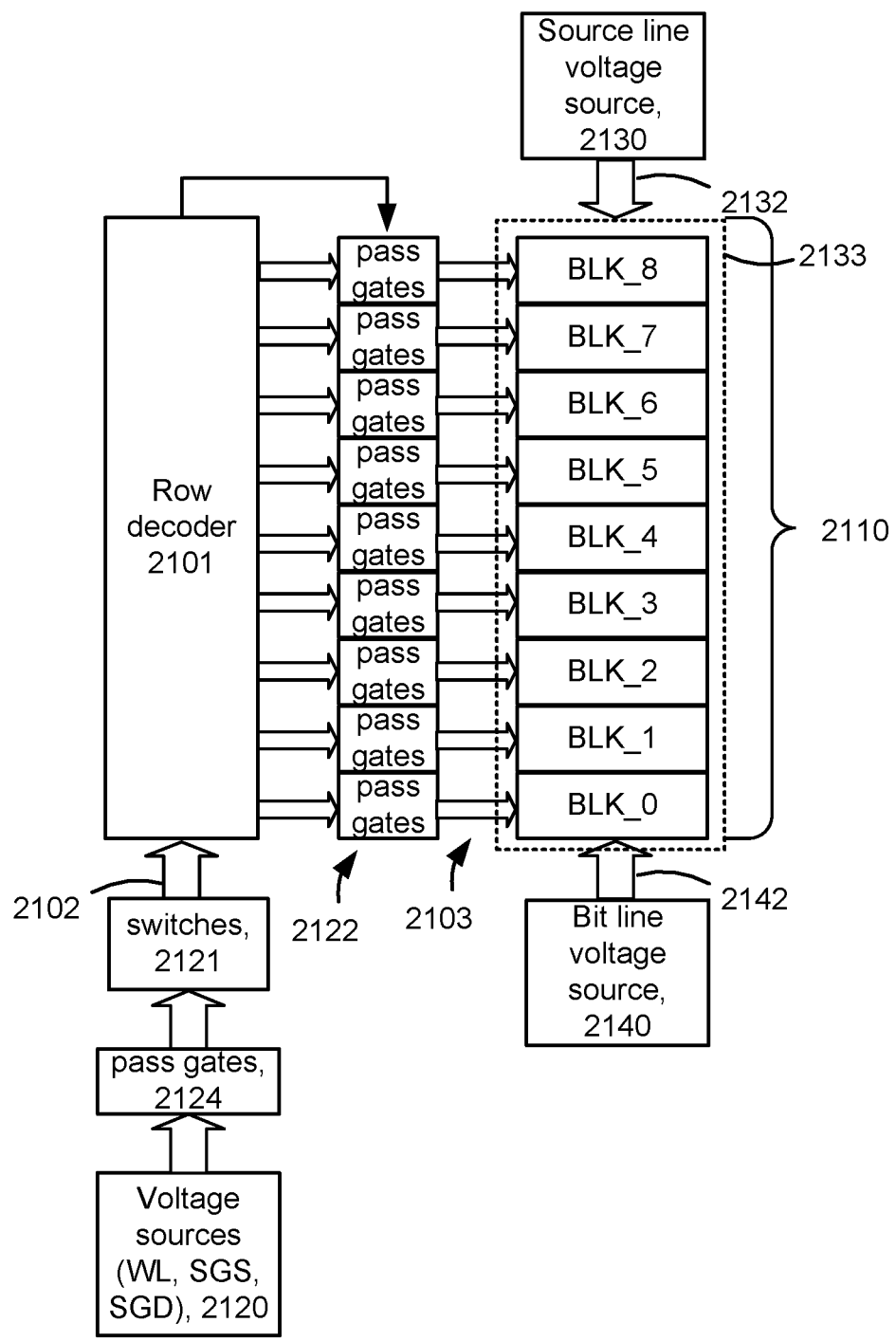
FIG. 21A depicts an example circuit for providing voltages to blocks of memory cells.

FIG. 21A depicts an example circuit for providing voltages to blocks of memory cells. In this example, a row decoder 2101 provides voltages to word lines and select gates of each block in set of blocks 2110. The set could be in a plane and includes blocks BLK_0 to BLK_8, consistent with FIG. 9B. The row decoder provides a control signal to pass gates 2122 which connect the blocks to the row decoder. Typically, operations, e.g., program, read or erase, are performed on one selected block at a time. The row decoder can connect global control lines 2102 to local control lines 2103. The control lines represent conductive paths. Voltages are provided on the global control lines from voltage sources 2120. The voltage sources may provide voltages to switches 2121 which connect to the global control lines. Pass gates 2124, also referred to as pass transistors or transfer transistors, are controlled to pass voltages from the voltage sources 2120 to the switches 2121.

The voltage sources 2120 can provided voltages on word lines (WL), SGS control gates and SGD control gates, for example.

During an erase operation for a block, 0 V may be provided on the global control lines which are connected to the local word lines of a selected block which is to be erased. An erase voltage, Ver, e.g., up to 20-25 V. may be provided on global control line which is connected to the local source line of the selected block, in one approach while control lines for the SGD control gates may float, for instance. During an erase verify operation, a verify voltage may be provided on global control lines which are connected to the local word lines of a selected block.

The various components, including the row decoder, may receive commands from a controller such as the state machine 112 or the controller 122 to perform the functions described herein.

A source line voltage source 2130 provides the voltage Vsl to the source lines/diffusion region in the substrate via control lines 2132. In one approach, the source diffusion region 2133 is common to the blocks. A set of bit lines 2142 is also shared by the blocks. A bit line voltage source 2140 provides voltages to the bit lines. In one possible implementation, the voltage sources 2120 are near the bit line voltage source.

Figure 21B:
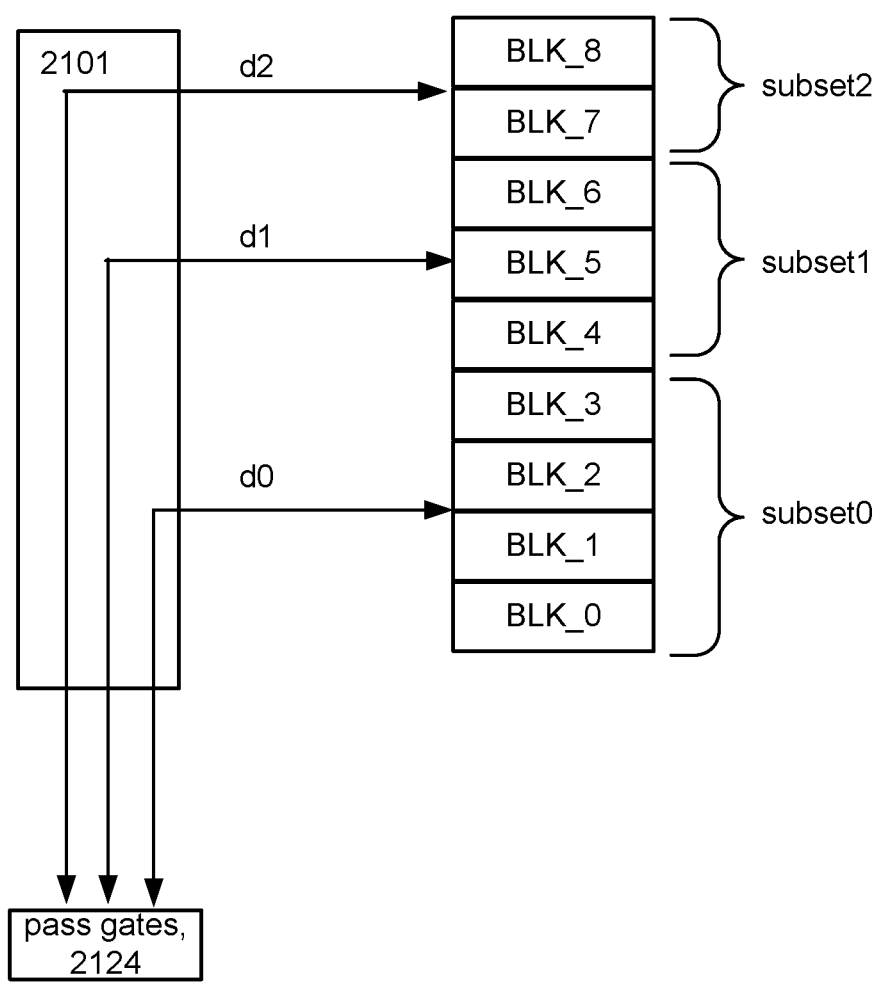
FIG. 21B depicts distances between the pass gates of the voltage sources and the blocks for different subsets of blocks, in the circuit of FIG. 21A.

FIG. 21B depicts distances between the pass gates of the voltage sources and the blocks for different subsets of blocks, in the circuit of FIG. 21A. The distances d0, d1 and d2 represent the distance from the pass gates 2124 to the subset0, subset1 and subset2 of blocks, respectively. As mentioned, subset0, subset1 and subset2 represent the close, midrange and far subsets of blocks, respectively. The number of subsets can be two or more. In this example, the voltage source for an erase voltage such as Vsgs is at one end of the set of blocks so that each block is progressively further from the pass gates of the voltage source. Other approaches are possible. For example, see FIG. 21C.

Figure 21C:
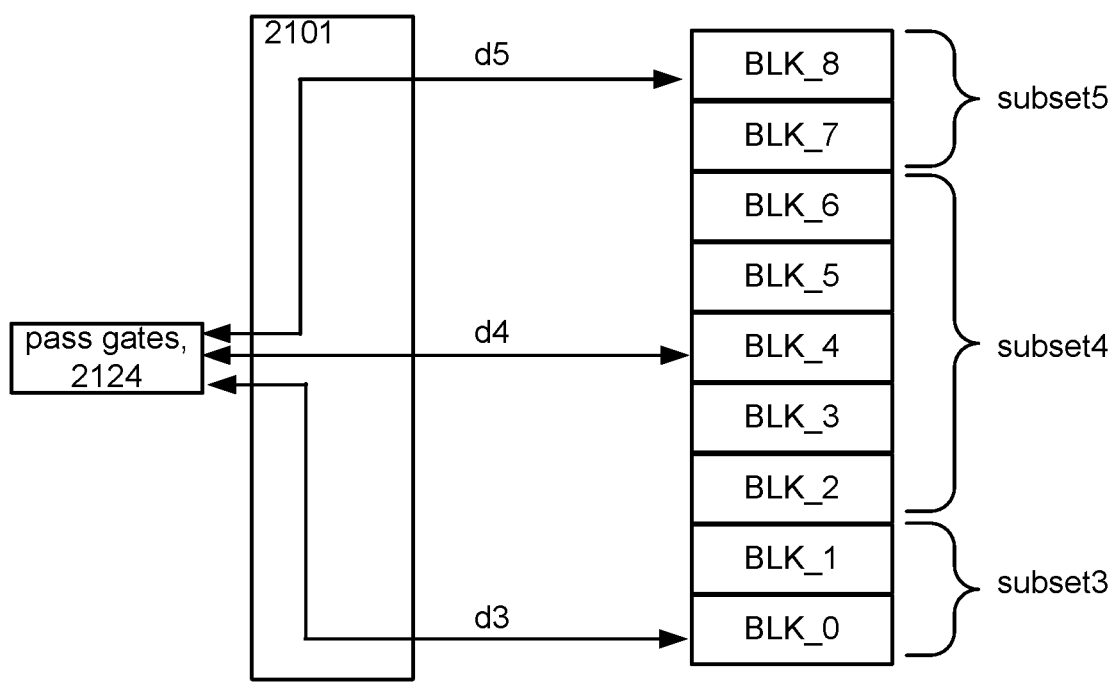
FIG. 21C depicts distances between the pass gates of the voltage sources and the blocks for different subsets of blocks, in another example circuit.

FIG. 21C depicts distances between the pass gates of the voltage sources and the blocks for different subsets of blocks, in another example circuit. Here, the pass gates 2124 of the voltage source are along the side of the set of blocks and midrange with respect to the set of blocks. Subset3, subset4 and subset5 include blocks BLK_0 to BLK_1, BLK_2 to BLK_6 and BLK_7 to BLK_8, respectively, with representative distances to the pass gates of d3, d4 and d5, respectively. In this example, d4 is the shortest distance and d3 and d5 are roughly equal, longer distances. Based on this longer distance, the erase operation for subset3 and subset5 can be made deeper to provide a uniform erase depth with the subset4. Alternatively, or additionally, the erase operation for subset4 can be made shallower to provide a uniform erase depth with subset3 and subset5.

In one implementation, an apparatus comprises: a plurality of blocks of memory cells; a voltage source, each block is at a different distance from a pass gate of the voltage source; and a control circuit, the control circuit configured to perform an erase operation for a selected block among the plurality of blocks using the voltage source, the erase operation is performed based on a distance of the selected block from the voltage source.

In one approach of the above-mentioned apparatus, the memory cells are arranged in strings, each string comprising a source end, a drain end, a channel extending between the source end and the drain end, and a select gate transistor at the source end or drain end; the control circuit, to perform the erase operation, is configured to charge up the channel of each string of the selected block by biasing the select gate transistor of each string of the selected block to generate holes in the channel by gate-induced drain leakage; and to bias the select gate transistor of each string of the selected block, the control circuit is configured to apply, to each string of the selected block, a source end voltage to the source end (e.g., Vsl) or a drain end voltage (e.g., Vbl) to the drain end, and to cause the voltage source to apply a select gate voltage to the select gate transistor of each string of the selected block.

In another implementation, a method comprises: in connection with an erase operation of a selected block of memory cells, wherein the memory cells are arranged in strings, each string comprising a source end, a drain end, a channel extending between the source end and the drain end, and a source end select gate transistor: providing a pass gate of a voltage source in a conductive state to pass a select gate voltage from the voltage source to each source end select gate transistor while providing a source end voltage to the source end of each string, wherein the select gate voltage is a function of a distance between the pass gate and the selected block.

In another implementation, an apparatus comprises: a voltage source; means for passing a voltage from the voltage source to a block of memory cells which is selected to undergo an erase operation; and means for causing the voltage source to provide a magnitude and/or duration of the voltage based on a distance of the block from the means for passing.

The means described above can include the components of the memory device 100 of FIG. 1A and FIG. 2, for example. The power control module 116, for instance, controls the power and voltages supplied to the word lines, select gate lines and bit lines during memory operations. Moreover, the means described above can include the components of FIG. 20A including the decoders, voltage drivers, switches and pass transistors. The means can further include any of the control circuits in FIGS. 1A and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of blocks of memory cells, the memory cells are arranged in strings, each string comprising a source end, a drain end, a channel extending between the source end and the drain end, and a select gate transistor at the source end;
a voltage source which comprises a pass gate and which provides a select gate voltage;
a voltage source which provides a source end voltage; and
a control circuit, the control circuit configured to, in an erase operation for a selected block among the plurality of blocks, connect the select gate voltage to the select gate transistors and connect the source end voltage to the source ends to charge up the channel of each string of the selected block by gate-induced drain leakage, wherein each select gate transistor has a positive channel-to-control gate voltage and a magnitude of the source end voltage minus the select gate voltage is based on an increasing function of a distance of the selected block from the pass gate.

2. The apparatus of claim 1, wherein:
the control circuit is configured to increase the source end voltage by a step size in erase loops; and
an initial magnitude of the source end voltage in the erase loops is based on an increasing function of the distance.

3. The apparatus of claim 1, wherein:
the control circuit is configured to increase the source end voltage by a step size in erase loops; and
the step size is an increasing function of the distance.

4. The apparatus of claim 1, wherein:
a duration of the source end voltage is based on an increasing function of the distance.

5. The apparatus of claim 1, wherein:
the control circuit is configured to set a duration of the source end voltage based on an increasing function of the distance in response to a determination that a temperature is below a threshold.

6. The apparatus of claim 1, wherein:
a duration of the source end voltage is based on an increasing function of the distance.

7. The apparatus of claim 1, wherein:
the memory cells are connected to word lines; and
the control circuit, in the erase operation, is configured to apply a voltage to the word lines which is based on a decreasing function of the distance.

8. The apparatus of claim 1, wherein:
the control circuit, to perform the erase operation, is configured to connect the select gate voltage to the select gate transistors and connect the source end voltage to the source ends in a series of erase loops, and to perform a verify test in each erase loop, wherein after the verify test is passed, the control circuit is configured to provide an additional erase pulse to the selected block if the distance exceeds a threshold.

9. The apparatus of claim 1, wherein:
the magnitude is lowest for a block which is closest to the pass gate and highest for a block which is further from the pass gate.

10. The apparatus of claim 1, wherein:
a magnitude of the source end voltage is independent of the distance.

11. The apparatus of claim 1, wherein:
the memory cells are connected to word lines; and
the control circuit, in the erase operation, is configured to set a control gate voltage for the memory cells which is less than the select gate when the channel of each string is charged up.

12. The apparatus of claim 1, wherein:
the control circuit is configured to set a magnitude of the source end voltage based on an increasing function of the distance in response to a determination that a temperature is above a threshold.

13. The apparatus of claim 1, wherein:
the source end of each string of the selected block comprises a source diffusion region which is common to the plurality of blocks; and
the control circuit is configured to provide a common magnitude and duration of the source end voltage during erase operations for each of the plurality of blocks.

14. A method, comprising:
in connection with an erase operation of a selected block of memory cells, wherein the memory cells are arranged in strings, each string comprising a source end, a drain end, a channel extending between the source end and the drain end, and a select gate transistor:
providing a pass gate of a voltage source in a conductive state to pass a select gate voltage from the voltage source to each select gate transistor while providing a source end voltage to the source end of each string, wherein the select gate voltage is based on a function of a distance between the pass gate and the selected block.

15. The method of claim 14, wherein:
a magnitude of the select gate voltage is based on a decreasing function of the distance.

16. The method of claim 14, wherein:
a duration of the select gate voltage is based on an increasing function of the distance.

17. The method of claim 14, wherein:
the selected block is among a plurality of blocks, each block of the plurality of blocks is at a different distance from the pass gate, the blocks are in subsets and a different select gate voltage is cross-referenced to each subset.

18. The method of claim 14, wherein:
the source end voltage is independent of the distance.

19. An apparatus, comprising:
a block of memory cells which is selected to undergo an erase operation, the memory cells are arranged in strings, each string comprising a source end, a drain end, a channel extending between the source end and the drain end, and a select gate transistor at the drain end;
means for providing a select gate voltage to the select gate transistors in the erase operation; and
means for providing a source end voltage to the source ends in the erase operation, the source end voltage has a duration which is based on an increasing function of a distance between the block and the means for providing the select gate voltage in response to a determination that a temperature is below a threshold, and the source end voltage has a magnitude which is based on an increasing function of the distance in response to a determination that the temperature is above a threshold.

20. The apparatus of claim 19, wherein:
the magnitude and/or duration of the source end voltage is set to equalize an erase depth for the block relative to an erase depth of another block having another distance to the means for providing the select gate voltage.

* * * * *